United States Patent
Chen et al.

(10) Patent No.: US 12,300,645 B2
(45) Date of Patent: May 13, 2025

(54) CONNECTOR AND METHOD FOR FORMING THE SAME

(71) Applicants: TAIWAN SEMICONDUCTOR MANUFACTURING COMPANY, LTD., Hsinchu (TW); National Yang Ming Chiao Tung University, Hsinchu (TW)

(72) Inventors: Chih Chen, Hsinchu (TW); Hsiang-Hou Tseng, New Taipei (TW)

(73) Assignees: Taiwan Semiconductor Manufacturing Company, Ltd., Hsinchu (TW); National Yang Ming Chiao Tung University, Hsinchu (TW)

( * ) Notice: Subject to any disclaimer, the term of this patent is extended or adjusted under 35 U.S.C. 154(b) by 496 days.

(21) Appl. No.: 17/866,209

(22) Filed: Jul. 15, 2022

(65) Prior Publication Data
US 2024/0021549 A1 Jan. 18, 2024

(51) Int. Cl.
*H01L 27/082* (2006.01)
*H01L 21/48* (2006.01)
(Continued)

(52) U.S. Cl.
CPC ............ *H01L 24/05* (2013.01); *H01L 21/486* (2013.01); *H01L 23/49827* (2013.01);
(Continued)

(58) Field of Classification Search
CPC . H01L 24/05; H01L 21/486; H01L 23/49827; H01L 24/03; H01L 24/08;
(Continued)

(56) References Cited

U.S. PATENT DOCUMENTS 8,802,504 B1    8/2014  Hou et al.
8,803,292 B2    8/2014  Chen et al.
(Continued)

FOREIGN PATENT DOCUMENTS

CN    106158674 A    11/2016
TW    201432828 A    8/2014
(Continued)

OTHER PUBLICATIONS

Chang et al., "Low temperature Ag—Ag direct bonding under air atmosphere", Journal of Alloys and Compounds 862 (2021) 158587, pp. 1-8.
(Continued)

*Primary Examiner* — Niki H Nguyen
(74) *Attorney, Agent, or Firm* — Birch, Stewart, Kolasch & Birch, LLP

(57) ABSTRACT

A method includes forming a first connector and a second connector over a first wafer and a second wafer, respectively, in which each of the first and second connectors are formed by forming an opening in a dielectric layer; depositing a first metal layer in the opening, in which the first metal layer has a nano-twinned structure with (111) orientation; and depositing a second metal layer over the first metal layer, the second metal layer and the first metal layer being made of different materials, in which the second metal layer has a nano-twinned structure with (111) orientation; attaching the first wafer to the second wafer, such that that the second metal layer of the first connector on the first wafer is in contact with the second metal layer of the second connector on the second wafer; and performing a thermo-compression process to bond the first and second wafers.

20 Claims, 34 Drawing Sheets

(51) Int. Cl.
*H01L 23/00* (2006.01)
*H01L 23/498* (2006.01)
*H01L 25/00* (2006.01)
*H01L 25/065* (2023.01)
*H01L 21/56* (2006.01)

(52) U.S. Cl.
CPC .............. *H01L 24/03* (2013.01); *H01L 24/08* (2013.01); *H01L 24/80* (2013.01); *H01L 25/0652* (2013.01); *H01L 25/0655* (2013.01); *H01L 25/0657* (2013.01); *H01L 25/50* (2013.01); *H01L 21/561* (2013.01); *H01L 24/94* (2013.01); *H01L 2224/03462* (2013.01); *H01L 2224/03464* (2013.01); *H01L 2224/05026* (2013.01); *H01L 2224/05083* (2013.01); *H01L 2224/05147* (2013.01); *H01L 2224/05166* (2013.01); *H01L 2224/05181* (2013.01); *H01L 2224/05186* (2013.01); *H01L 2224/05573* (2013.01); *H01L 2224/05639* (2013.01); *H01L 2224/08145* (2013.01); *H01L 2224/08225* (2013.01); *H01L 2224/80092* (2013.01); *H01L 2224/80203* (2013.01); *H01L 2224/80439* (2013.01); *H01L 2224/94* (2013.01); *H01L 2224/97* (2013.01); *H01L 2924/04941* (2013.01); *H01L 2924/04953* (2013.01)

(58) Field of Classification Search
CPC . H01L 24/80; H01L 25/0652; H01L 25/0655; H01L 25/0657; H01L 21/561; H01L 24/94; H01L 2224/03462; H01L 2224/03464; H01L 2224/05026; H01L 2224/05083; H01L 2224/05147; H01L 2224/05166; H01L 2224/05181; H01L 2224/05573; H01L 2224/05639; H01L 2224/08145; H01L 2224/08225; H01L 2224/80092; H01L 2224/80203; H01L 2224/94; H01L 2224/97; H01L 2924/04941; H01L 2924/04953; H01L 24/16; H01L 24/81; H01L 24/27; H01L 2224/81191; H01L 2224/81203; H01L 2224/16503; H01L 2224/81895; H01L 2224/16147; H01L 2224/16227; H01L 2224/16145; H01L 21/76877; H01L 2225/06513; H01L 2224/81201; H01L 2225/06541; H01L 2224/13076; H01L 2224/08121; H01L 2225/06517; H01L 2224/83201; H01L 2224/838; H01L 27/14636; H01L 27/14634; H01L 24/06; H01L 24/09; H01L 24/14
See application file for complete search history.

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 11,508,691 | B2 * | 11/2022 | Yang ................. H01L 24/80 |
| 2015/0275350 | A1 | 10/2015 | Ott et al. |
| 2022/0271001 | A1 * | 8/2022 | Yang ................. H01L 24/80 |

FOREIGN PATENT DOCUMENTS

| | | |
|---|---|---|
| TW | I476839 B | 3/2015 |
| TW | I629728 B | 7/2018 |
| TW | I703226 B | 9/2020 |
| TW | I709213 B | 11/2020 |
| TW | 202308084 A | 2/2023 |

OTHER PUBLICATIONS

Chou et al., "Electrical and Reliability Investigation of Cu-to-Cu Bonding with Silver Passivation layer in 3D Integration", IEEE Transactions on Components, Packaging and Manufacturing Technology, 2020, pp. 1-8.

Huang et al., "Low Temperature Cu—Cu Bonding with Electroless Deposited Metal Passivation for Fine-Pitch 3D Packaging", 2021 IEEE 71st Electronic Components and Technology Conference (ECTC), pp. 377-382.

Lai et al., "Characterization of interfacial structure for low-temperature direct bonding of Si substrates sputtered with Ag nanotwinned films", Materials Characterization 175 (2021) 111060, pp. 1-12.

Oh et al., "Pressureless Bonding Using Sputtered Ag Thin Films", Journal of Electronic Materials, 2014, vol. 43, No. 12 , pp. 4406-4412.

Wu et al., "Characterization of (111)-Oriented Ag Nano-twinned Films on (111) Si Substrates", International Journal of Mining, Materials, and Metallurgical Engineering (IJMMME), 2021, vol. 7, pp. 16-21.

* cited by examiner

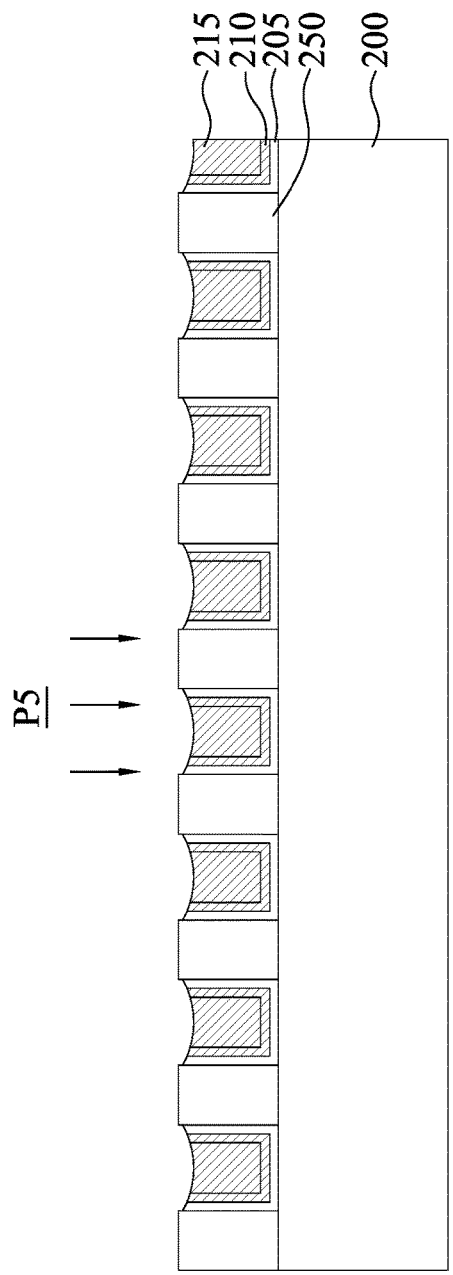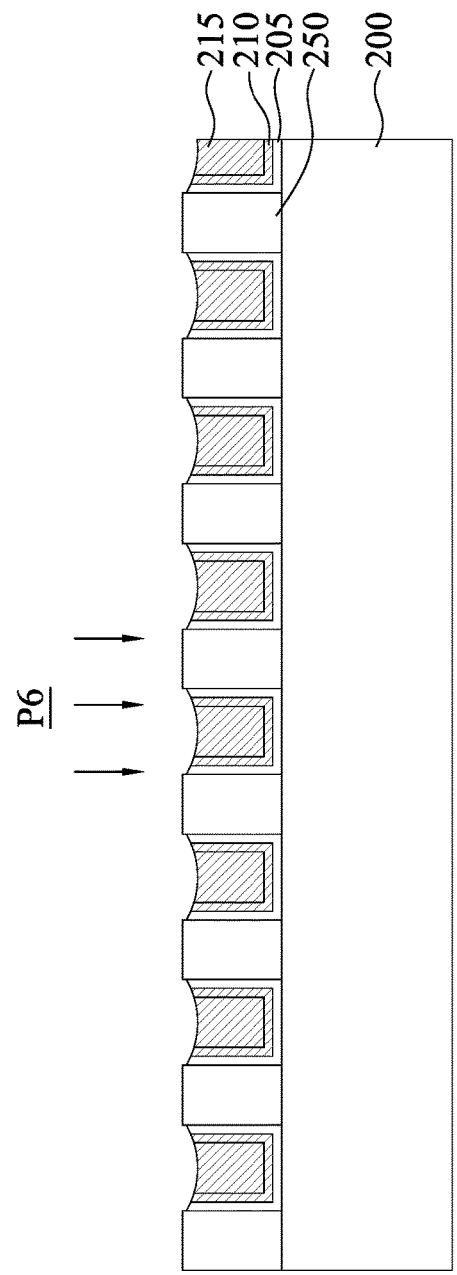

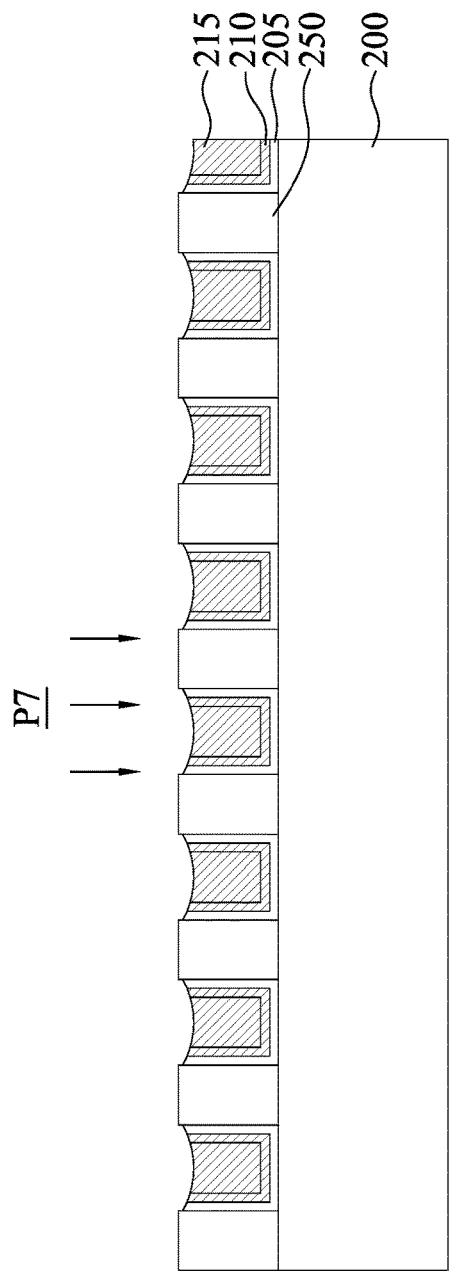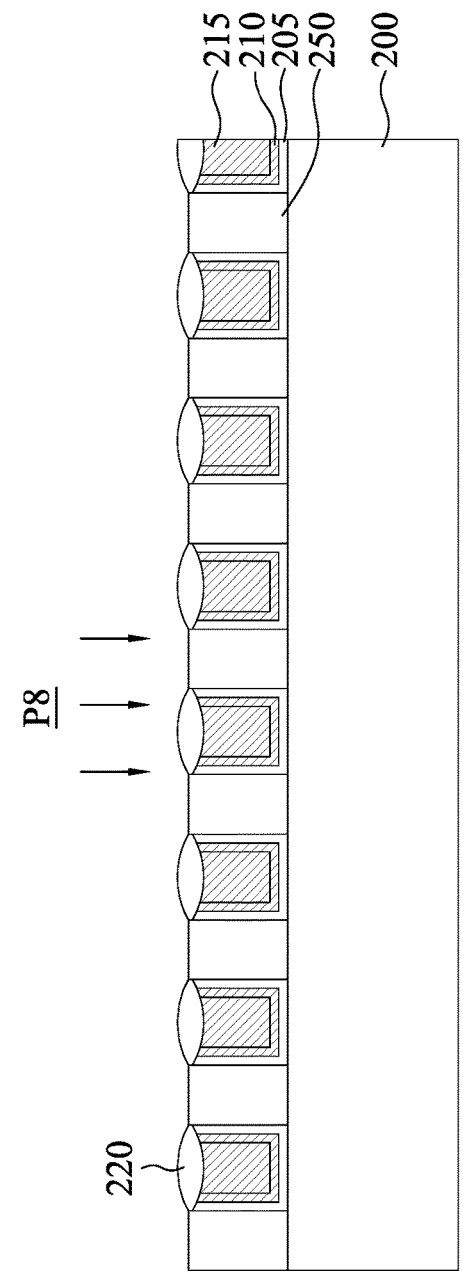

CONNECTOR AND METHOD FOR FORMING THE SAME

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6 to 23 show various stages of a sequential manufacturing operation for wafer to wafer bonding in accordance with some embodiments of the present disclosure.

DETAILED DESCRIPTION

Figure 1:
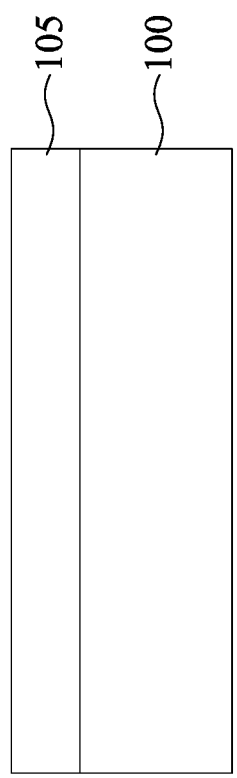
FIGS. 1 to 5 show various stages of a sequential manufacturing operation for wafer to wafer bonding in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 to 5 show various stages of a sequential manufacturing operation for wafer to wafer bonding in accordance with some embodiments of the present disclosure.

Reference is made to FIG. 1. Shown there is a substrate 100. The substrate 100 is made of a suitable elemental crystalline semiconductor, such as silicon, diamond or germanium; a suitable alloy or compound crystalline semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, crystalline silicon is used as the substrate 100. In some embodiments, the substrate 100 is a P-type substrate, which includes P-type dopants or impurities. Examples of p-type dopants can be boron (B), gallium (Ga), indium (In), aluminium (Al), or the like.

A metal layer 105 is disposed over the substrate 100. In some embodiments, the metal layer 105 may be made of titanium (Ti). In some other embodiments, the metal layer 105 may be made of Ru, Ta, W, Co, Ni, Al, Nb, or other suitable metal material. In some embodiments, the thickness of the metal layer 105 is in a range from about 90 nm to about 110 nm, such as 100 nm. In some embodiments, the metal layer 105 may be formed over the substrate 100 using suitable deposition process, such as a physical vapor deposition (PVD) process, chemical vapor deposition (CVD) process, atomic layer deposition (ALD) process, or the like.

Figure 2A:
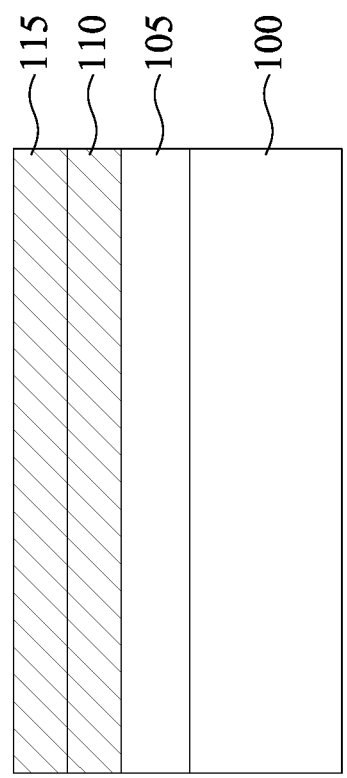

Reference is made to FIG. 2A. A metal seed layer 110 is deposited over the metal layer 105. Afterwards, a metal layer 115 is deposited over the metal seed layer 110. In some embodiments, the metal seed layer 110 may be formed by a physical vapor deposition (PVD) process and/or chemical vapor deposition (CVD) process. In some embodiments, the thickness of the metal seed layer 110 is in a range from about 180 nm to about 220 nm, such as 200 nm. In some embodiments, the metal seed layer 110 is deposited to form a continuous layer over the metal layer 105, so as to provide continuously conductive surface for forming the bulk of the metal layer 115 during an electro-plating process. In some embodiments, the metal seed layer 110 is made of copper (Cu).

In some embodiments, the metal layer 115 is made of twinned copper. The twinned copper is also referred to as nano-twinned copper or nano-twinned crystal copper. Here, the term of "twin" in materials may represent two crystals with a mirror symmetry relationship, in accordance with some embodiments. This copper microstructure can be achieved via electrodeposition method using suitable plating additive. The artificial microstructure possesses high density nanometer-spacing twins in columnar grain with unidirectional (111) orientation. Accordingly, the twinned copper can also be referred to as (111)-oriented twinned copper. In some embodiments, the metal layer 115 and the metal seed layer 110 may include different crystalline structures. For example, the metal layer 115 is made of nano-twinned copper, while the metal seed layer 110 is made of regular copper.

Figure 2B:
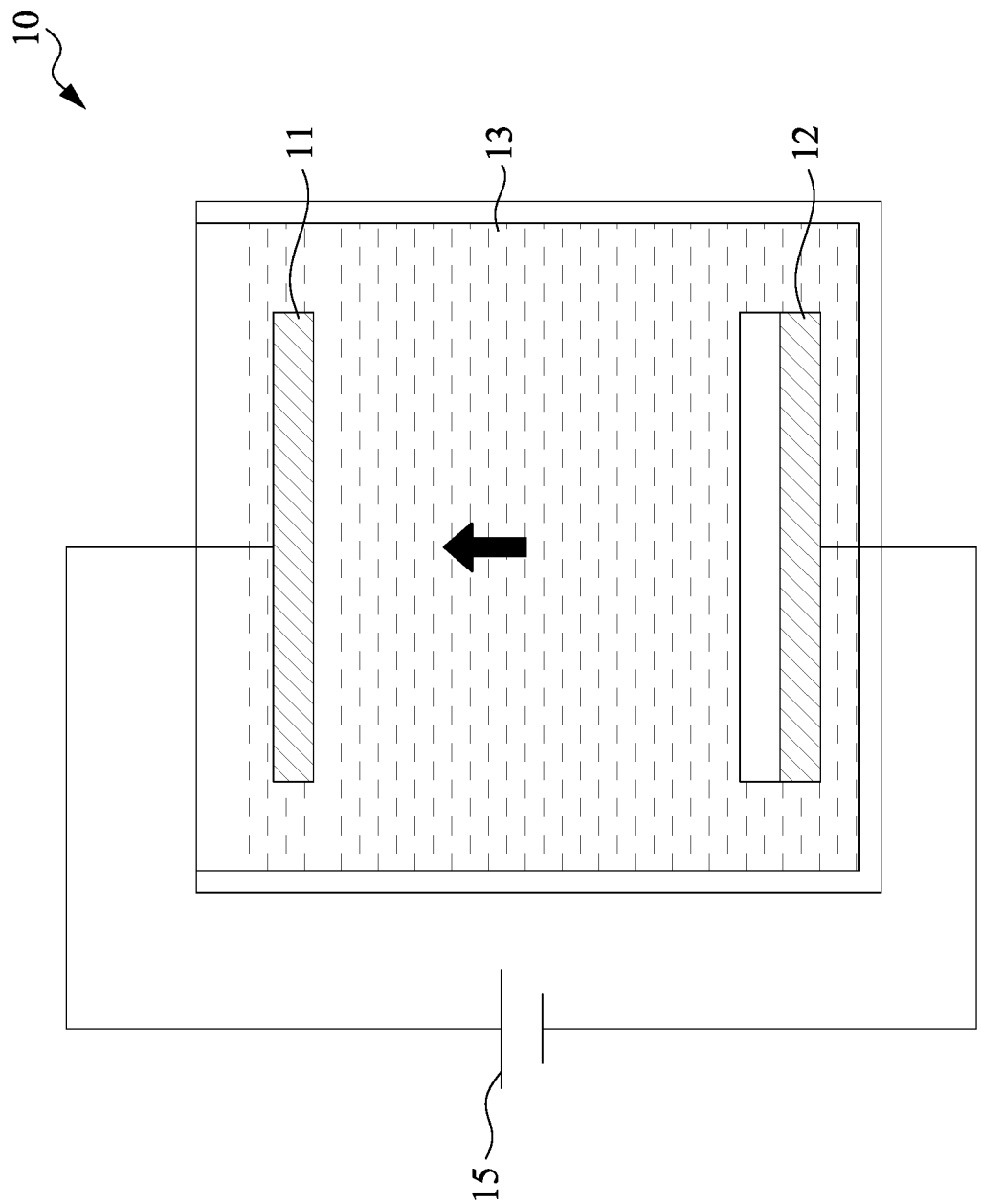

In some embodiments, the formation of the metal layer 115 may use an electroplating device 10 as shown in FIG. 2B. The electroplating device 10 includes an anode 11, a cathode 12, which are immersed in a plating solution 13 and are each connected to a direct current electrical power supply source 15. In some embodiments, the anode 11 is made from a material including metal copper, phosphorus copper or inert anode (for example, titanium-plated platinum). The cathode 12 may be made from a material including silicon substrate (e.g., the substrate 100 of FIG. 2A) having its surface plated by copper seed layer (e.g., the metal seed layer 110 of FIG. 2A), and can be made from a material selected from a group consisting of glass substrate having its surface plated by conductive layer and seed layer, conductive layer and seed layer plated surface glass substrate, quartz substrate, metal substrate, plastic substrate, or printed circuit board etc.

The plating solution 13 may include copper sulfate powder, sulfuric acid ($H_2SO_4$), and hydrochloric acid (HCl). Other surfactant or lattice modification agent can also be added in the plating solution 13. In some embodiments, the copper sulfate powder includes about 0.6M to about 1.0M, such as 0.8M. The sulfuric acid may be 96% sulfuric acid including about 90 g/L to about 110 g/L (e.g., 100 g/L). The hydrochloric acid includes about 30 ppm to about 50 ppm (e.g., 40 ppm). The other surfactant or lattice modification agent may include 3 ml/L to about 4 ml/L (e.g., 3.5 ml/L).

Next, a direct current is used in electroplating, such that nano-twinned copper layer (e.g., the metal layer 115) are grown from the cathode 12 in the direction pointed by the arrow as shown in FIG. 2B. A rotational speed of about 1200 rpm is applied to the plating solution 13. The electroplating is performed under room temperature (e.g., to about 27° C.) and pressure about 1 atm. During the growth process, the (111) surface of the twins and the planar surface of the nano-twinned copper metal layer are roughly perpendicularly to the electric field orientation. The fully grown nano-twinned copper metal layer may include a plurality of crystal grains, in which the crystal grins are formed by twinned copper. Since the nano-twins extend to reach the surface, (111) surface is still exposed on the surface. The thickness of the metal layer 115 of FIG. 2A achieved from electroplating is about 2 μm to about 20 μm, such as 5 μm.

Figure 2C:
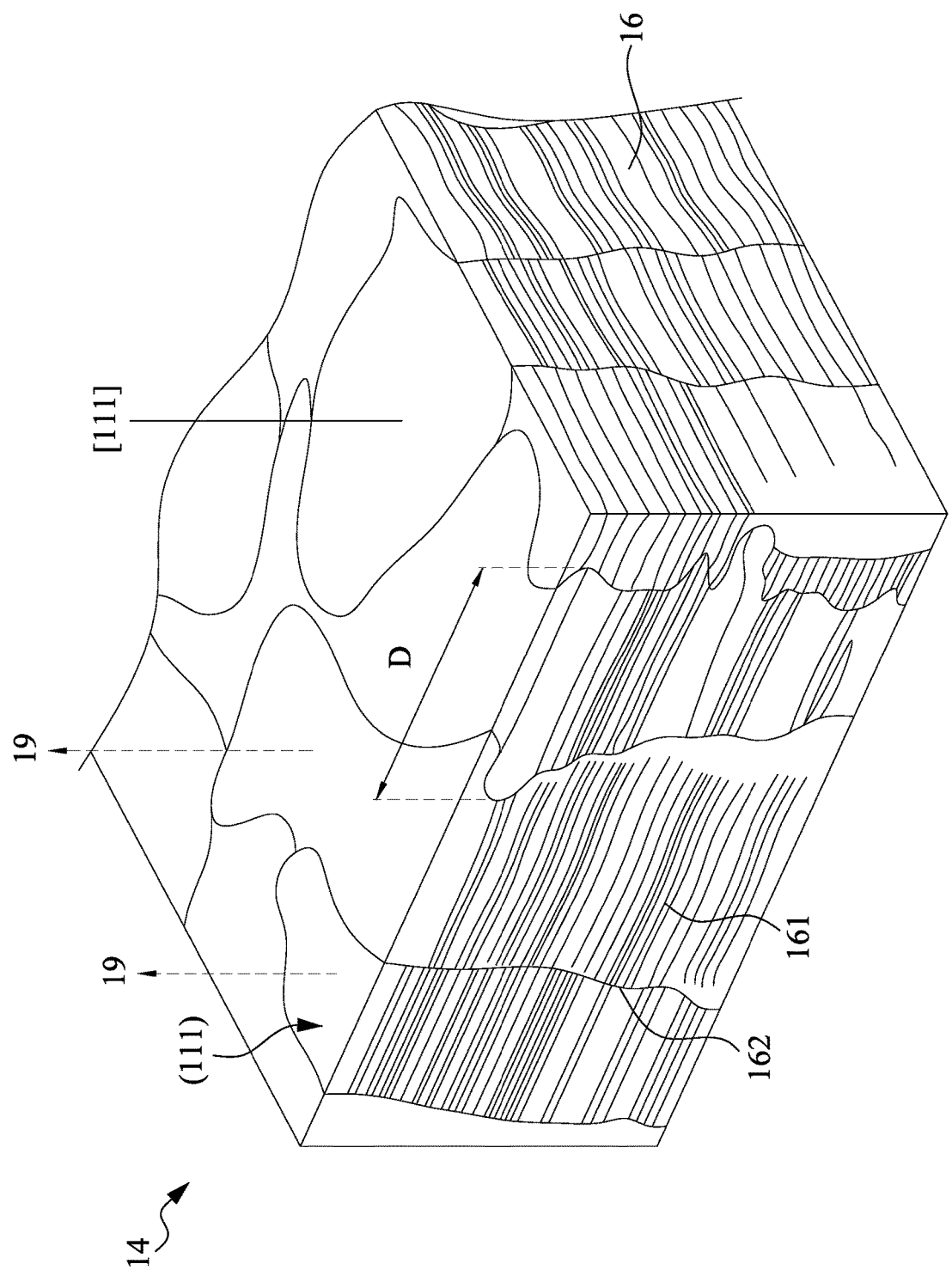

FIG. 2C is a schematic view of the nano-twinned copper layer in accordance with some embodiments of the present disclosure. In particular, FIG. 2C illustrates a crystalline structure of the metal layer 115 of FIG. 2A, which is made of a nano-twined copper layer. The nano-twined copper layer 14 shown in FIG. 2C includes a plurality of columnar crystal grains 16, and each crystal grain has a plurality of layer-shaped nano-twinned copper (for example, neighboring black line and white line constitute a twins copper, and are stacked in a stacking direction 19 to form crystal grains 16). The diameter D of these columnar crystal grains 16 can range from about 0.5 μm to 8 μm and the height of the grains 16 can range from about 0.1 μm to 20 μm, nano-twins plane 161 (level striation) and the (Ill) planar surface are parallel to each other, crystalline grain boundary 162 can be found between twins crystals.

After the metal layer 115 is formed over the metal seed layer 110, a chemical mechanism polishing (CMP) process may be performed to planarize the top surface of the metal layer 115.

Figure 3A:
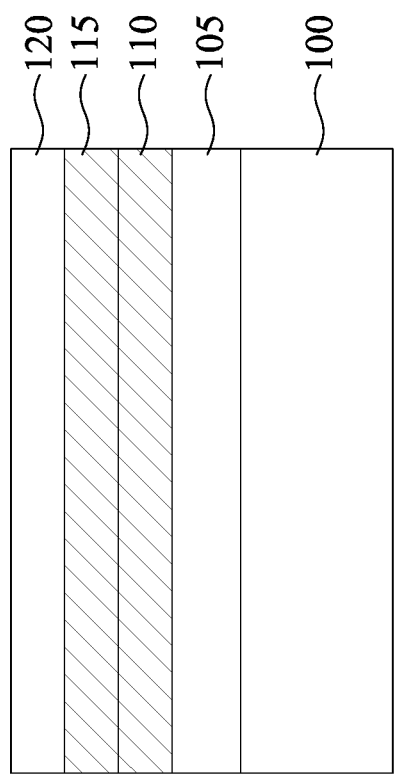

Reference is made to FIG. 3A. A metal layer 120 is deposited over the metal layer 115. In some embodiments, the metal layer 120 is made of a different material than the metal layer 115. For example, the metal layer 120 may be made of silver (Ag). In some embodiments, the metal layer 120 may be made of silver (Ag), and the metal layer 115 may be made of copper (Cu). In some embodiments, the thickness of the metal layer 120 is in a range from about 10 nm to about 300 nm.

In some embodiments, the metal layer 120 is made of twinned silver. The twinned silver is also referred to as nano-twinned silver or nano-twinned crystal silver. The twinned silver may include (111) orientation. Accordingly, the twinned copper can also be referred to as (111)-oriented twinned copper. In some embodiments, the metal layer 120 is formed with a twinned structure with (111) orientation because the underlying metal layer 115 having substantially the same crystalline structure. In some embodiments where the metal layer 115 does not include a twins structure with (111) orientation, the metal layer 120 may not include a twins structure with (111) orientation.

FIGS. 3B to 3I illustrate sequential operations for forming the metal layer 120 of FIG. 3A in accordance with some embodiments of the present disclosure. In greater details, FIGS. 3B to 3I illustrate an electroless deposition for depositing the metal layer 120 over the metal layer 115. In greater details, the wafer W which includes the structure shown in FIG. 2A is sequentially immersed in different tanks filled with different liquids, as will be discussed later.

Figure 3B:
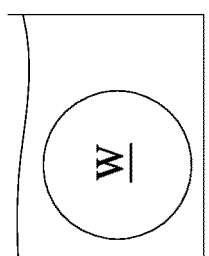

In FIG. 3B, the wafer W is moved into a tank T1, and is immersed in acetone. In some embodiments, the acetone is used to remove organic materials on the top surface of the metal layer 115. The immersion of FIG. 3B is performed under room temperature (e.g., 25° C. to about 27° C.) for about 30 second to about 2 min (e.g., 1 min). In some embodiments, ultrasonic vibration may be applied during the immersion to facilitate the removal of organic materials.

Figure 3C:
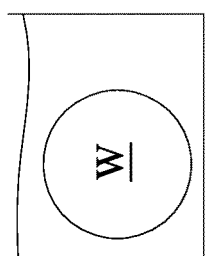

In FIG. 3C, the wafer W is moved into a tank T2, and is immersed in a rising liquid. In some embodiments, the rising liquid may include sulfuric acid, surfactants, or water, and may be used to remove the acetone (see FIG. 3B) remaining on the metal layer 115. In some embodiments, the immersion of FIG. 3C is performed under 40° C. to about 50° C. (e.g., 45° C.) for about 1 min to about 3 min (e.g., 2 min).

Figure 3D:
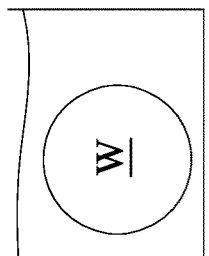

In FIG. 3D, the wafer W is moved into a tank T3, and is immersed in deionized water (DI-water). In some embodiments, the deionized water may be used to remove the rising liquid (see FIG. 3C) remaining on the metal layer 115. In some embodiments, the immersion of FIG. 3D is performed under room temperature (e.g., 25° C. to about 27° C.) for about 10 second to about 30 second (e.g., 20 second).

Figure 3E:
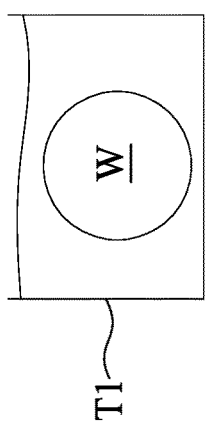

In FIG. 3E, the wafer W is moved into a tank T4, and is immersed in sulfuric acid. In some embodiments, the sulfuric acid may be 5% sulfuric acid, and is used to etch away native oxide, such as copper oxide, over the surface of the metal layer 115. The immersion of FIG. 3E is performed under room temperature (e.g., 25° C. to about 27° C.) for about 30 second to about 2 min (e.g., 1 min). In some embodiments, ultrasonic vibration may be applied during the immersion to facilitate the removal of native oxide.

Figure 3F:
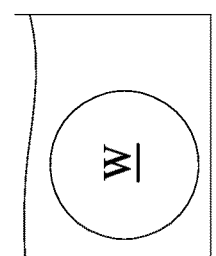

In FIG. 3F, the wafer W is moved into a tank T5, and is immersed in deionized water (DI-water). In some embodiments, the deionized water may be used to remove the sulfuric acid (see FIG. 3E) remaining on the metal layer 115. In some embodiments, the immersion of FIG. 3F is performed under room temperature (e.g., 25° C. to about 27° C.) for about 10 second to about 30 second (e.g., 20 second).

Figure 3G:
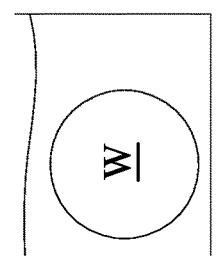

In FIG. 3G, the wafer W is moved into a tank T6, and is immersed in a first solution. In some embodiments, the first solution includes a solvent to provide metal source that is going to be formed over the metal layer 115. For example, the solvent of the first solution may include silver source, such as silver nitrate ($AgNO_3$) for deposition of Ag film. In some embodiments, the immersion of FIG. 3G is performed under 30° C. to about 50° C. (e.g., 40° C.) for about 30 second to about 60 second (e.g., 45 second). In some embodiments, the operation of FIG. 3G can be referred to as a pre-dip process.

Figure 3H:
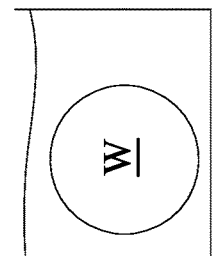

In FIG. 3H, the wafer W is moved into a tank T7, and is immersed in a second solution. In some embodiments, the second solution includes a solvent to provide metal source that is going to be formed over the metal layer 115. In some embodiments, the immersion of FIG. 3H is performed under 35° C. to about 55° C. (e.g., 45° C.) for about 60 second to about 180 second (e.g., 60 second).

The second solution includes the same solvent as the first solution of FIG. 3G. For example, the solvent of the second solution may include silver source, such as silver nitrate ($AgNO_3$) for deposition of Ag film. However, the concentration of the solvent (e.g., $AgNO_3$) of the second solution in FIG. 3H is higher than that of the first solution in FIG. 3G. In particular, the first solution (FIG. 3G) with lower concentration of silver nitrate is used to form a continuous thin Ag film over the surface of the metal layer 115. Furthermore, contamination may be left in the first solution of tank T6 to prevent contaminating the second solution in tank T7. Afterwards, the second solution (FIG. 3H) with higher concentration of silver nitrate is used to form a thicker Ag film over the surface of the metal layer 115 with desired thickness.

Figure 3I:
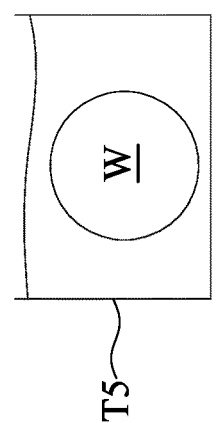

In FIG. 3I, the wafer W is moved into a tank T8, and is immersed in deionized water (DI-water). In some embodiments, the deionized water may be used to remove the second solution (see FIG. 3H) remaining on the metal layer 115. In some embodiments, the immersion of FIG. 3I is performed under 50° C. to about 70° C. (e.g., 60° C.) for about 30 second to about 2 min (e.g., 1 min).

Referring back to FIG. 3A, the metal layer 120 is formed by an electroless plating process. In contrast, the metal layer 115 is formed by an electroplating process. In some embodiments where the metal layer 120 formed by other deposition process, such as electroplating process, PVD, CVD, ALD, the metal layer 120 may not present satisfying crystalline structure (e.g., nano-twins structure), which in turn will deteriorate the bonding process as discussed below. Moreover, some deposition processes, such as PVD, CVD, or ALD do not provide selective deposition, thus metal layer will be formed blanket over the wafer, and therefore additional process, such as etching, may be needed to remove unwanted material.

Figure 4:
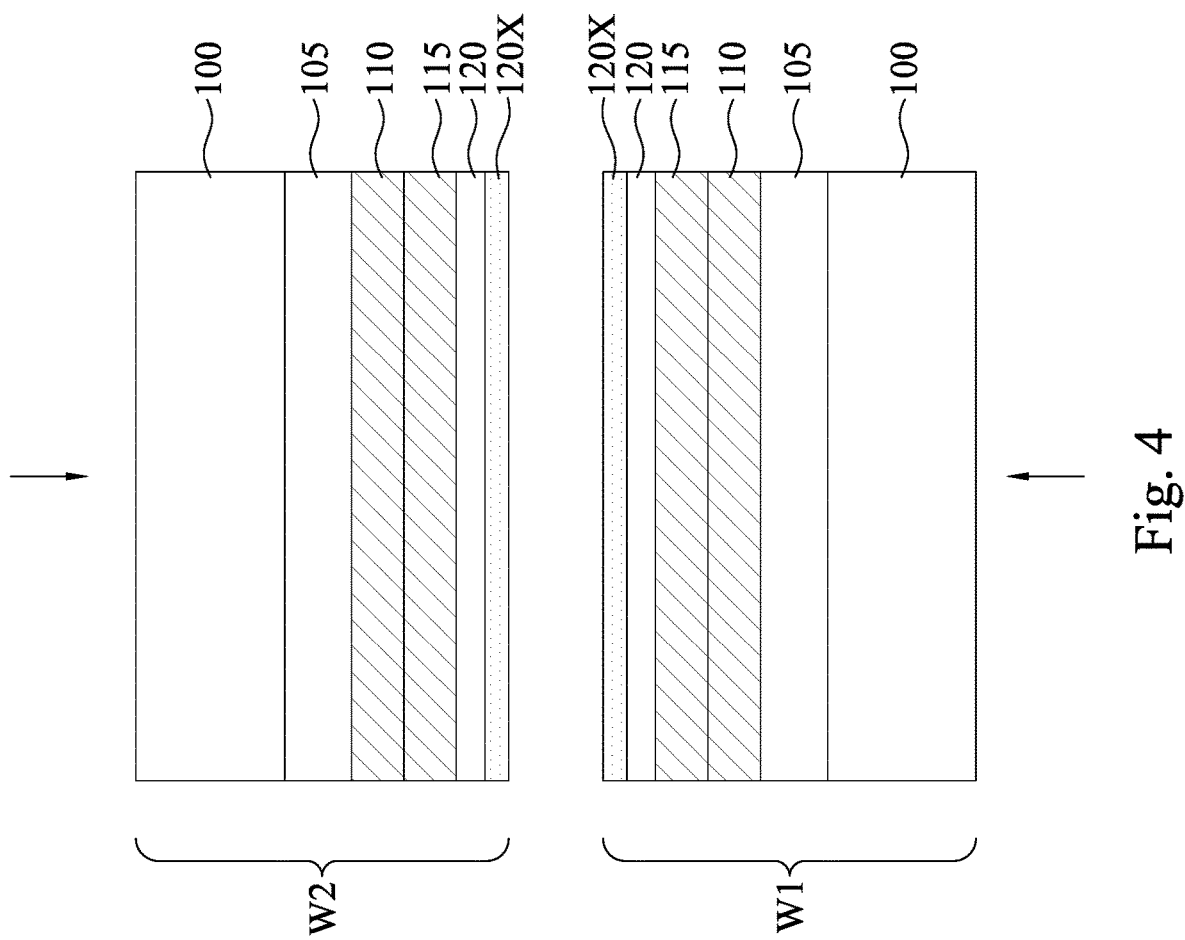

Reference is made to FIG. 4, in which FIG. 4 is an example of a wafer bonding process using the structure formed by the processes as described in FIG. 1 to 3I. Shown there are two semiconductor wafers W1 and W2. In such embodiments, the wafers W1 and W2 may include substantially a same configuration formed by the processes as described in FIGS. 1 to 3I. For example, each of the wafers W1 and W2 includes a substrate 100, a metal layer 105 over the substrate 100, a metal seed layer 110 over the metal layer 105, a metal layer 115 over the metal seed layer 110, and a metal layer 120 over the metal layer 115.

In some embodiments, because the wafers W1 and W2 may be exposed to the air, a thin native oxide layer 120X may be formed on the exposed surface of the metal layer 120 of each of the wafers W1 and W2. For example, if the metal layer 120 is made of silver (Ag), the oxide layer 120X may be silver oxide.

One of the wafers W1 and W2 may be rotated one-hundred and eighty degrees. For example, in FIG. 4, the wafer W2 is rotated one-hundred and eighty degrees, such that the metal layer 120 of the wafer W1 will face the metal layer 120 of the wafer W2. The metal layer 120 of the wafer W1 may be bonded together with the metal layer 120 of the wafer W2 in following process, which may join the wafers W1 and W2.

Figure 5:
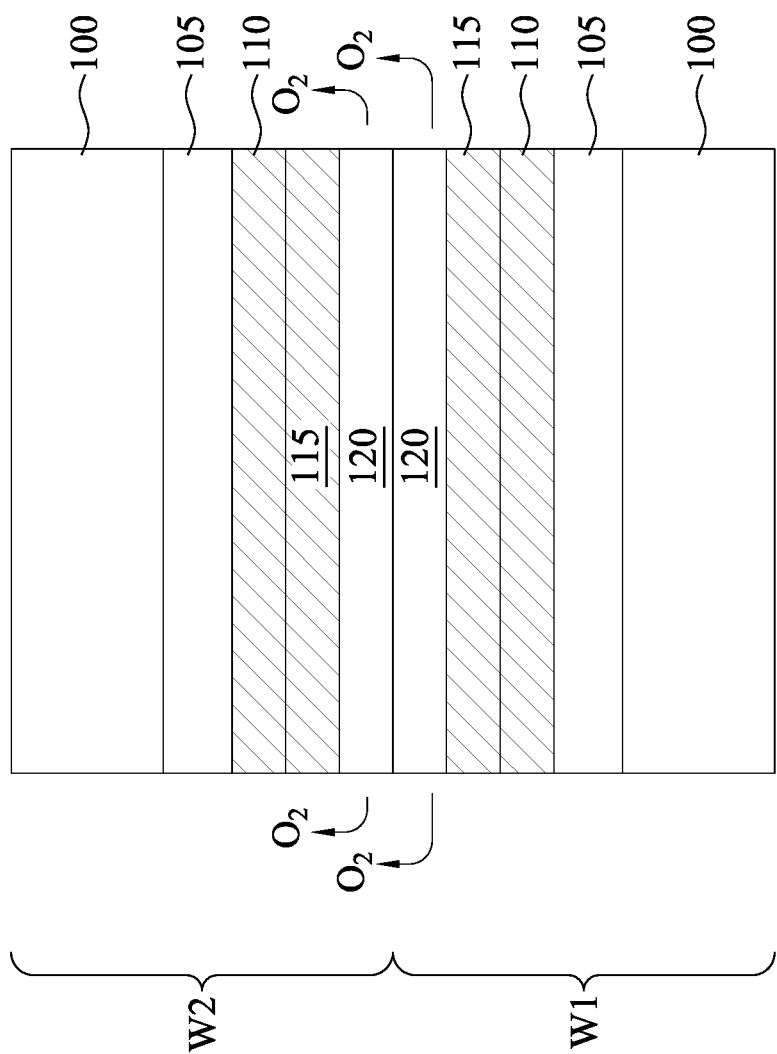

Reference is made to FIG. 5. The wafers W1 and W2 are pressed against each other, such that the metal layer 120 of the wafer W1 is in contact with the metal layer 120 of the wafer W2. In some embodiments, the wafers W1 and W2 are bonded with each other using thermo-compression bonding process.

As mentioned above, the metal layer 120 may be made of silver, and the oxide layer 120X may be made of silver oxide (see FIG. 4). In some embodiments, the silver oxide may be decomposed into silver and oxygen under a temperature in a range from about 160° C. to about 200° C. (e.g., 180° C.). Accordingly, if the temperature of the bonding process is in a range from about 160° C. to about 200° C. (e.g., 180° C.) or lower than about 200° C., the oxide layer 120X will be decomposed, and oxygen will be released from the structures (see arrows in FIG. 5), leaving the metal layer 120 having a pure metal surface (e.g., silver) for bonding process. That is, even if the oxide layer 120X will be formed on the surface of the metal layer 120 due to exposure to the air, the oxide layer 120X will be decomposed during the thermo-compression bonding process. Accordingly, by using the metal layer 120 made of silver as a bonding layer, the thermo-compression bonding process can be performed in a low temperature and can be performed under atmospheric pressure. However, if the metal layer 115 layer made of copper is used as a bonding layer, high temperature and vacuum environment may be needed during the bonding process.

As mentioned above, the metal layer 120 is made of silver, which has a face-center-cubic (FCC) structure. In some embodiments, silver atoms have highest diffusion rate at (111) surface of the FCC structure. As mentioned above, the metal layer 120 made of silver has a (111) orientation, and thus the time duration and the temperature for the bonding process can be significantly reduced. In some embodiments, the thermo-compression bonding process may be performed for about 10 min to about 30 min.

Embodiments of the present disclosure provide a bonding structure, in which the bonding structure includes a first metal layer (e.g., the metal layer 115) and a second metal layer (e.g., the metal layer 120) over the first metal layer. The first metal layer is made of copper with nano-twinned structure. The second metal layer made of silver can be formed over the first metal layer using an electroless plating deposition process, such that the second metal layer also includes a nano-twinned structure. The electroless plating deposition process is a selective deposition process, and thus the process cost can be reduced. Furthermore, the bonding process using silver as bonding layer can reduce bonding temperature and bonding time, and can be performed under atmosphere pressure rather than vacuum environment. If the second metal layer is omitted, the first metal layer made of copper made be used as a bonding layer, while copper gets oxidized easily and will deteriorate the bonding process. If the second metal layer is deposited by other deposition process, such as PVD, the second metal layer may not include satisfying crystalline structure, which will deteriorate the bonding process. Moreover, PVD does not provide selective deposition, and thus process cost may be increased.

FIGS. 6 to 23 show various stages of a sequential manufacturing operation for wafer to wafer bonding in accordance with some embodiments of the present disclosure. It is noted that some elements of FIGS. 6 to 23 are similar to those described in FIGS. 1 to 5, and thus relevant details will not be repeated for brevity.

Figure 6:
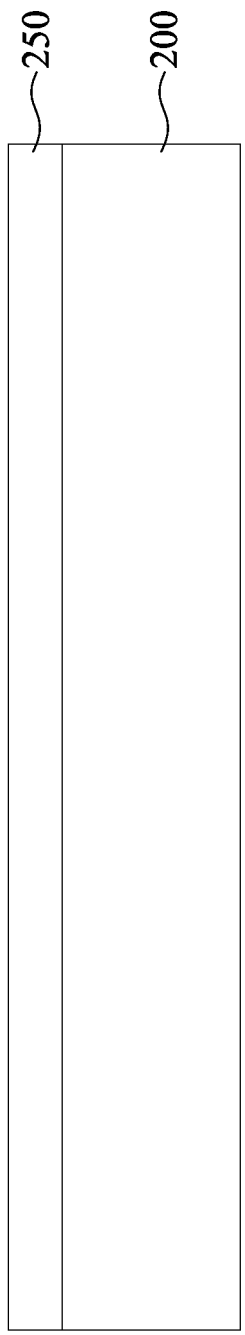

Reference is made to FIG. 6. Shown there is a substrate 200, in which the substrate 200 may be similar to the substrate 100 as described in FIGS. 1 to 5. A dielectric layer 250 is deposited over the substrate 200. In some embodiments, the dielectric layer 250 may be made of oxide, such as silicon oxide. In some other embodiments, the dielectric layer 250 may be made of nitride, oxynitride, or other suitable dielectric materials. In some embodiments, the dielectric layer 250 may be deposited using suitable deposition process, such as plasma-enhanced CVD (PECVD), PVD, atomic layer deposition (ALD), or the like.

Figure 7:
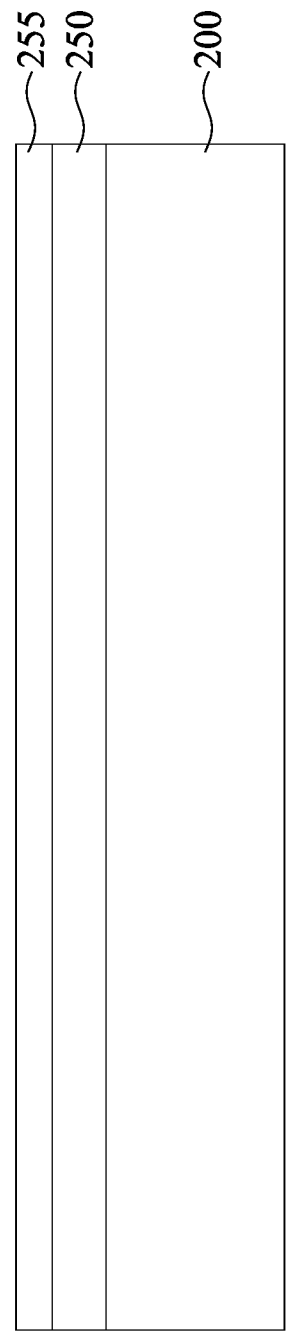

Reference is made to FIG. 7. A mask layer 255 is formed over the dielectric layer 250. In some embodiments, the mask layer 255 is a photoresist. The photoresist may be suitable material used in the art, such as Poly(methyl methacrylate) (PMMA), Poly(methyl glutarimide) (PMGI), Phenol formaldehyde resin (DNQ/Novolac), SU-8, and may be either positive or negative photoresist. The material of mask layer 255 may be applied as a liquid and, generally, spin-coated to ensure uniformity of thickness.

Figure 8:
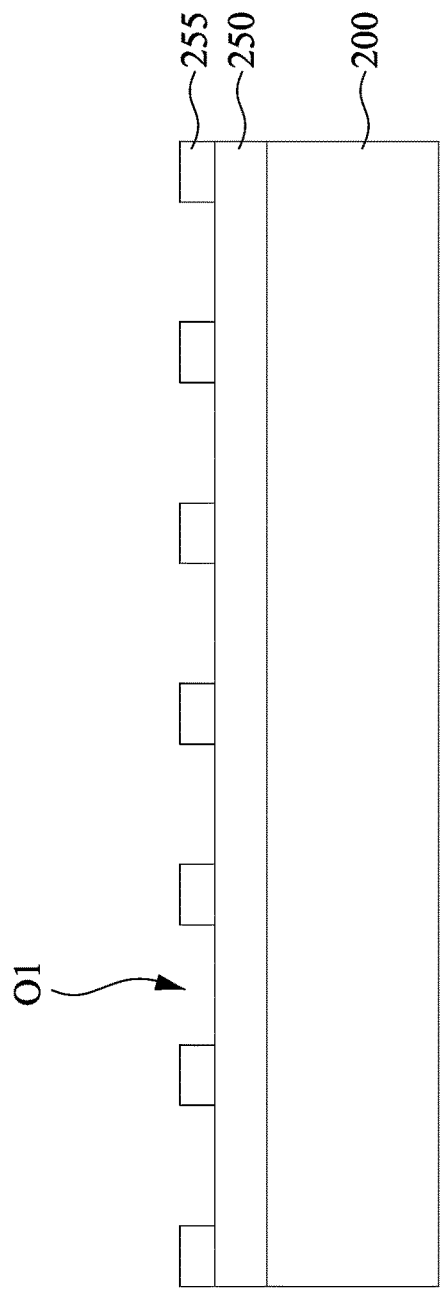

Reference is made to FIG. 8. The mask layer 255 is patterned to form openings O1 in the mask layer 255. In some embodiments, the mask layer 255 may be patterned using photolithography patterning processes. The photolithography patterning processes may include photoresist coating, soft baking, mask aligning, exposure, post-exposure baking, developing the photoresist, rinsing, drying (e.g., hard baking), other suitable processes, and/or combinations thereof.

Figure 9:
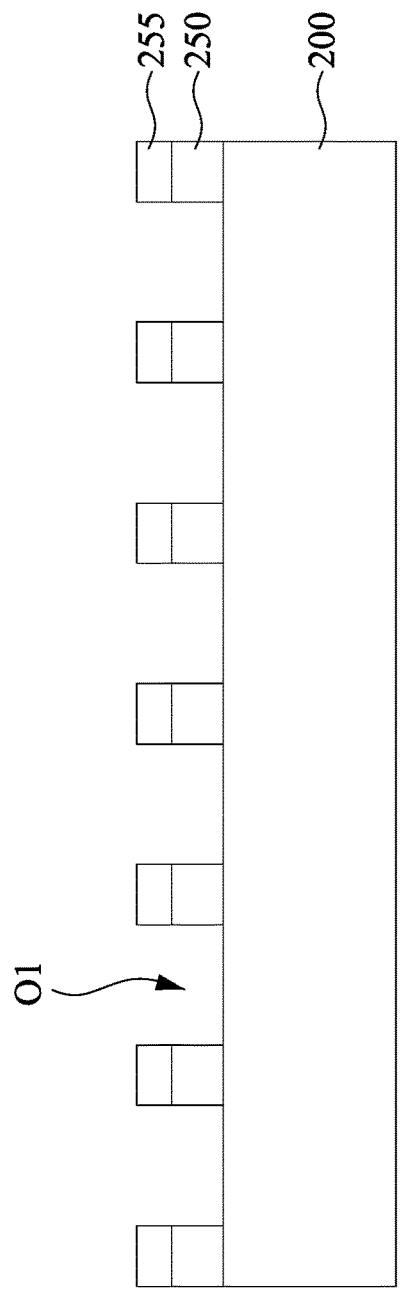

Reference is made to FIG. 9. The dielectric layer 250 is etched by using the mask layer 255 as an etch mask. In greater details, portions of the dielectric layer 250 exposed through the openings O1 of the mask layer 255 are removed, so as to extend the openings O1 of the mask layer 255 into the dielectric layer 250. The dielectric layer 250 may be etched using suitable etching process, such as dry etch, wet etch, or combinations thereof. In some embodiments, after the etching process is completed, top surface of the substrate 200 may be exposed.

Figure 10:
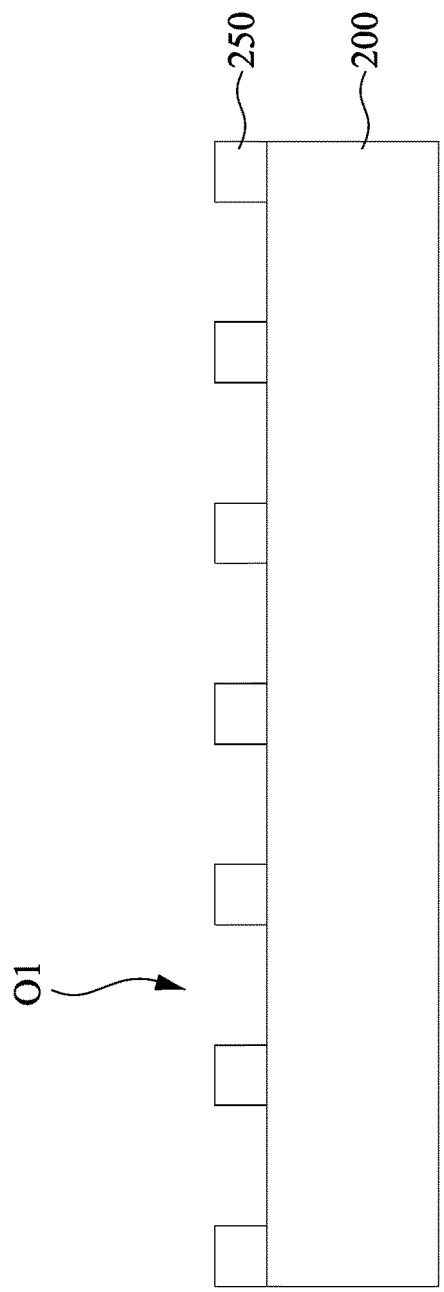

Reference is made to FIG. 10. The mask layer 255 is removed. In some embodiments where the mask layer 255 is a photoresist, the mask layer 255 may be removed by a lift-off process. After the mask layer 255 is removed, top surface of the dielectric layer 250 may be exposed.

Figure 11:
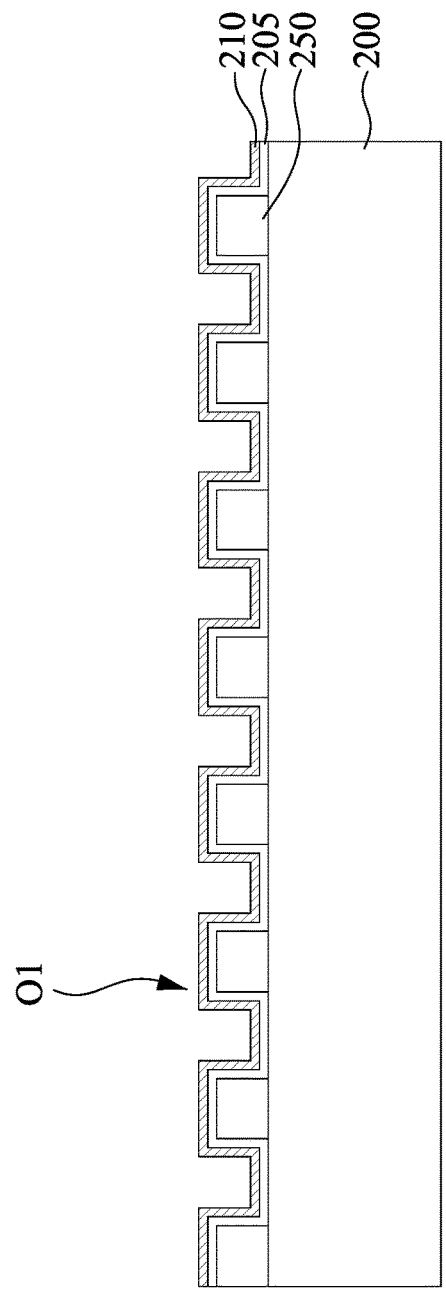

Reference is made to FIG. 11. An adhesion layer 205 is deposited over the substrate 200. Afterwards, a metal seed layer 210 is deposited over the adhesion layer 205. In some embodiments, the adhesion layer 205 is deposited with a conformal manner, such that the adhesion layer 205 may conformally extend along surfaces of the dielectric layer 250 and the substrate 200. The adhesion layer 205 may include metal such as titanium, titanium nitride, tantalum, tantalum nitride, and combinations thereof, and is formed using physical vapor deposition, sputtering, or the like. The adhesion layer helps to improve the adhesion of the subsequently formed metal seed layer 210 onto the dielectric layer 250.

In some embodiments, the metal seed layer 210 may be formed by a physical vapor deposition (PVD) process and/or chemical vapor deposition (CVD) process. In some embodiments, the metal seed layer 110 is deposited to form a continuous layer over the metal layer 105, so as to provide continuously conductive surface for forming the bulk of the metal layer 215 (see FIG. 12) during an electro-plating process. In some embodiments, the metal seed layer 110 is made of copper (Cu).

Figure 12:
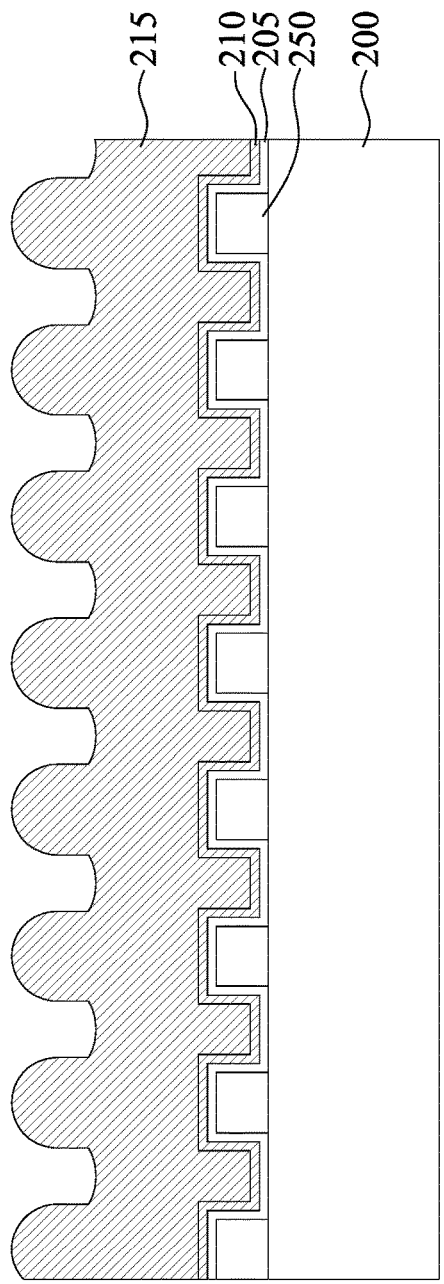

Reference is made to FIG. 12. A metal layer 215 is deposited over the metal seed layer 210 and overfilling the openings O1 of the dielectric layer 250. The metal layer 215 may be deposited using electroplating process as the metal layer 115 as described in FIGS. 1 to 5.

In some embodiments, the metal layer 215 is made of twinned copper. The twinned copper is also referred to as nano-twinned copper or nano-twinned crystal copper. Here, the term of "twin" in materials may represent two crystals with a mirror symmetry relationship, in accordance with some embodiments. This copper microstructure can be achieved via electrodeposition method using suitable plating additive. The artificial microstructure possesses high density nanometer-spacing twins in columnar grain with unidirectional (111) orientation. Accordingly, the twinned copper can also be referred to as (111)-oriented twinned copper.

Figure 13:
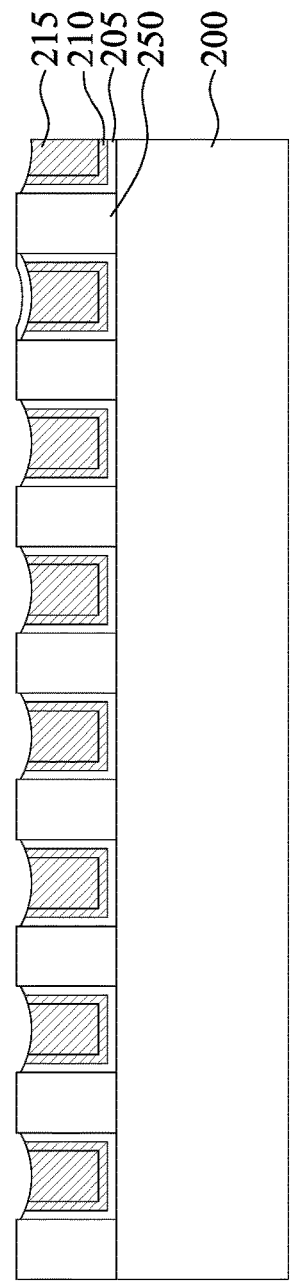

Reference is made to FIG. 13. A chemical mechanism polishing (CMP) process is performed to remove excess metal layer 215 until top surface of the dielectric layer 250 is exposed. In some embodiments, during the CMP process, dishing effect may occur. Accordingly, after the CMP process is completed, each portion of the metal layer 215 remaining in the openings O1 of the dielectric layer 250 may include a concave top surface.

Reference is made to FIGS. 14 to 21, in which FIGS. 14 to 21 illustrate sequential operations for forming a metal layer 220 (see FIG. 21). In greater details, the operations discussed in FIGS. 14 to 21 is similar to those described in FIGS. 3B to 3I, which include an electroless deposition for depositing the metal layer 220 over the metal layer 215.

Figure 14:
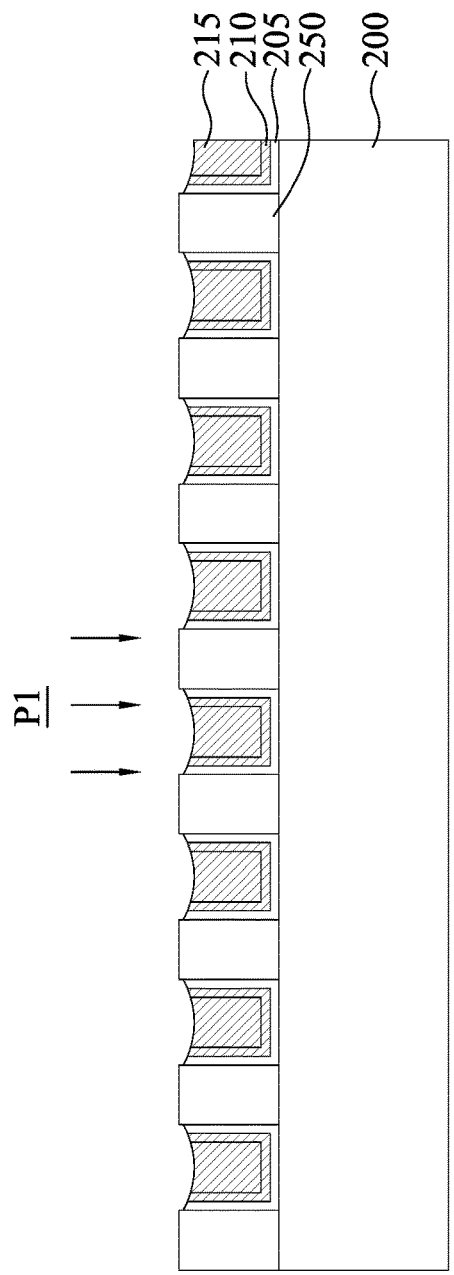

In FIG. 14, a treatment P1 is performed, in which the structure of FIG. 13 is immersed in acetone. In some embodiments, the acetone is used to remove organic materials on the top surface of the metal layer 215. The immersion of FIG. 14 is performed under room temperature (e.g., 25° C. to about 27° C.) for about 30 second to about 2 min (e.g., 1 min). In some embodiments, ultrasonic vibration may be applied during the immersion to facilitate the removal of organic materials.

Figure 15:
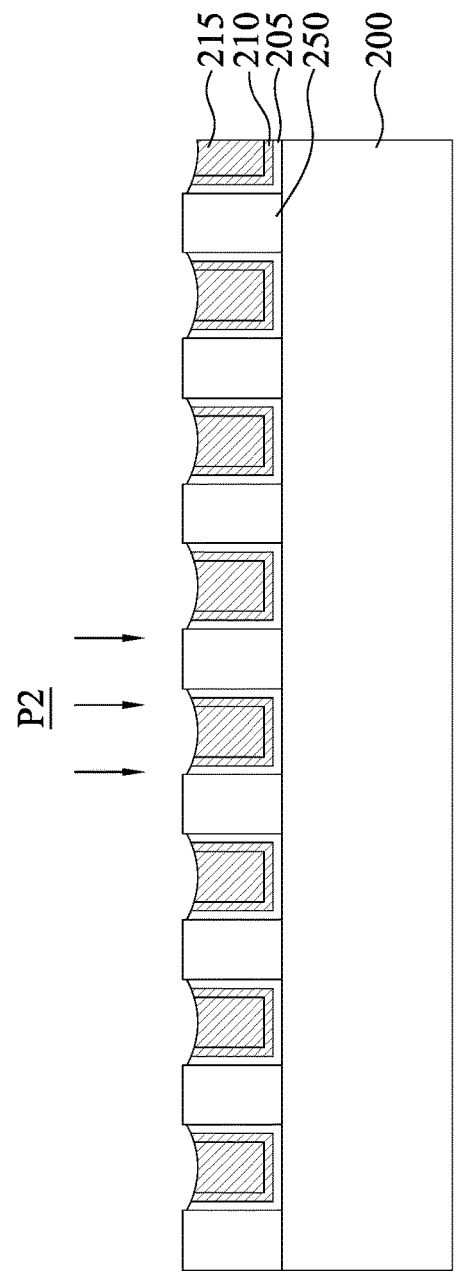

In FIG. 15, a treatment P2 is performed, in which the structure of FIG. 14 is immersed in rising liquid. In some embodiments, the rising liquid may include sulfuric acid, surfactants, or water, and may be used to remove the acetone (see FIG. 14) remaining on the metal layer 215. In some embodiments, the immersion of FIG. 15 is performed under 40° C. to about 50° C. (e.g., 45° C.) for about 1 min to about 3 min (e.g., 2 min).

Figure 16:
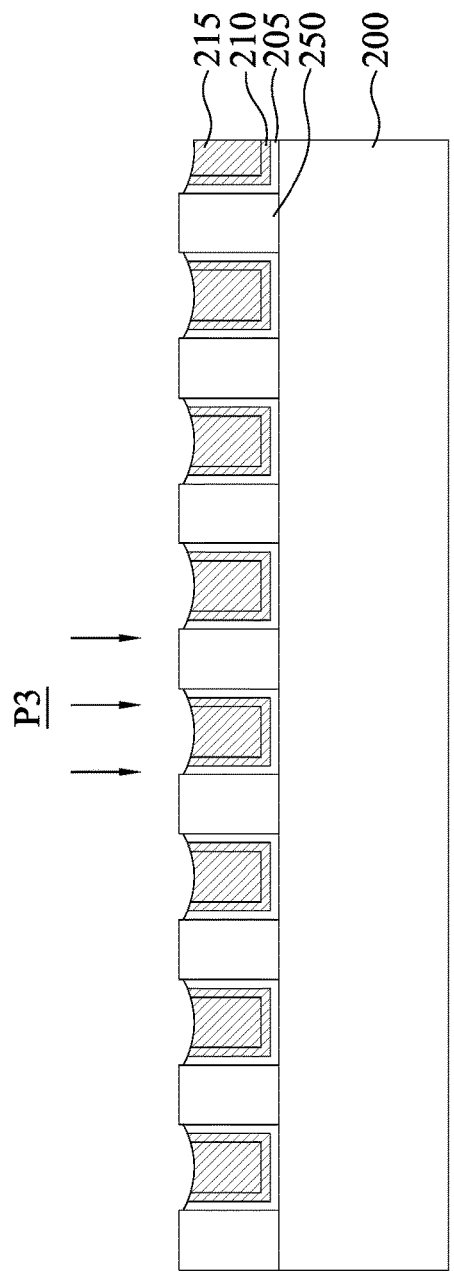

In FIG. 16, a treatment P3 is performed, in which the structure of FIG. 15 is immersed in deionized water (DI-water). In some embodiments, the deionized water may be used to remove the rising liquid (see FIG. 15) remaining on the metal layer 215. In some embodiments, the immersion of FIG. 16 is performed under room temperature (e.g., 25° C. to about 27° C.) for about 10 second to about 30 second (e.g., 20 second).

Figure 17:
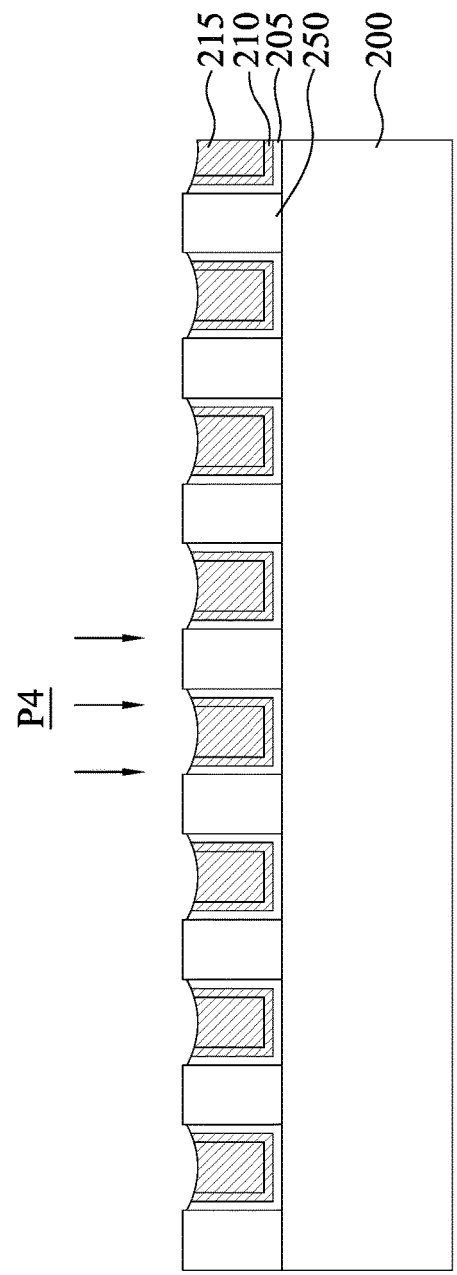

In FIG. 17, a treatment P4 is performed, in which the structure of FIG. 16 is immersed in sulfuric acid. In some embodiments, the sulfuric acid may be 5% sulfuric acid, and is used to etch away native oxide, such as copper oxide, over the surface of the metal layer 215. The treatment P4 can also be referred to as a micro-etching process. The immersion of FIG. 17 is performed under room temperature (e.g., 25° C. to about 27° C.) for about 30 second to about 2 min (e.g., 1 min). In some embodiments, ultrasonic vibration may be applied during the immersion to facilitate the removal of native oxide.

In FIG. 18, a treatment P5 is performed, in which the structure of FIG. 17 is immersed in deionized water (DI-water). In some embodiments, the deionized water may be used to remove the sulfuric acid (see FIG. 17) remaining on the metal layer 215. In some embodiments, the immersion of FIG. 3F is performed under room temperature (e.g., 25° C. to about 27° C.) for about 10 second to about 30 second (e.g., 20 second).

In FIG. 19, a treatment P6 is performed, in which the structure of FIG. 18 is immersed in a first solution. In some embodiments, the first solution includes a solvent to provide metal source that is going to be formed over the metal layer 215. For example, the solvent of the first solution may include silver nitrate ($AgNO_3$) for deposition of Ag film. In some embodiments, the immersion of FIG. 19 is performed under 30° C. to about 50° C. (e.g., 40° C.) for about 30 second to about 60 second (e.g., 45 second). In some embodiments, the operation of FIG. 19 can be referred to as a pre-dip process.

In FIG. 20, a treatment P7 is performed, in which the structure of FIG. 19 is immersed in a second solution, so as to form a metal layer 220 over the metal layer 215. In some embodiments, the second solution includes a solvent to provide source of the metal layer 215 that is going to be formed over the metal layer 215. In some embodiments, the immersion of FIG. 20 is performed under 35° C. to about 55° C. (e.g., for about 60 second to about 180 second (e.g., 60 second).

The second solution includes the same solvent as the first solution of FIG. 19. For example, the solvent of the second solution may include silver nitrate ($AgNO_3$) for deposition of Ag film. However, the concentration of the solvent (e.g., $AgNO_3$) of the second solution in FIG. 20 is higher than that of the first solution in FIG. 19. In particular, the first solution (FIG. 19) with lower concentration of silver nitrate is used to form a continuous thin Ag film over the surface of the metal layer 215. Furthermore, contamination may be left in the first solution to prevent contaminating the second solution. Afterwards, the second solution (FIG. 20) with higher concentration of silver nitrate is used to form a thicker Ag film over the surface of the metal layer 215 with desired thickness.

In some embodiments, the metal layer 220 is selectively formed on the exposed surfaces of the adhesion layer 205, the metal seed layer 210, and the metal layer 215, and is not formed on the exposed surfaces of the dielectric layer 250. That is, the metal layer 220 has higher deposition rate on the adhesion layer 205, the metal seed layer 210, and the metal layer 215 than on the dielectric layer 250.

In FIG. 21, a treatment P8 is performed, in which the structure of FIG. 20 is immersed in deionized water (DI-water). In some embodiments, the deionized water may be used to remove the second solution (see FIG. 20) remaining on the metal layer 220. In some embodiments, the immersion of FIG. 21 is performed under 50° C. to about 70° C. (e.g., 60° C.) for about 30 second to about 2 min (e.g., 1 min).

Figure 22:
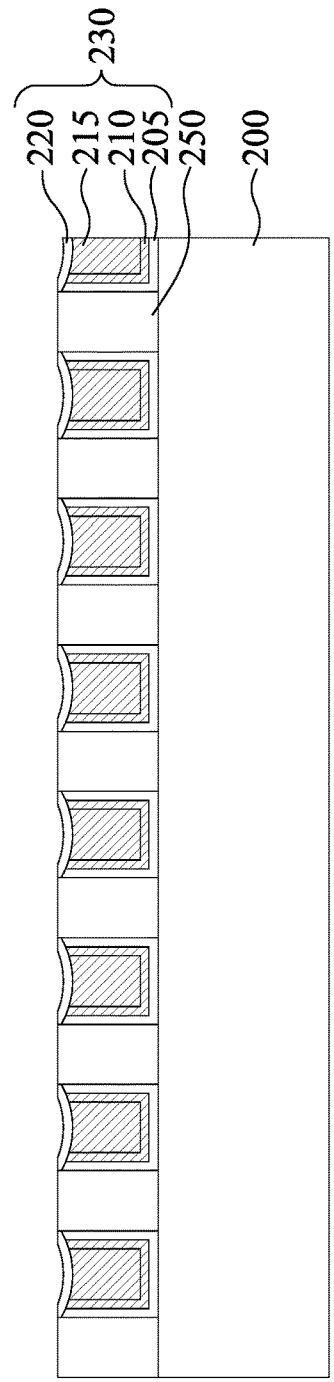

Reference is made to FIG. 22. A chemical mechanism polishing (CMP) process is performed to remove excess metal layer 220 until top surface of the dielectric layer 250 is exposed. In some embodiments, during the CMP process, dishing effect may occur. Accordingly, after the CMP process is completed, each portion of the metal layer 220 over the metal layer 215 may include a concave top surface.

After the CMP process is completed, a plurality of connectors 230 are formed. Each of the connectors 230 may include the adhesion layer 205, the metal seed layer 210, the metal layer 215, and the metal layer 220. In some embodiments, the metal layer 220 may be in contact with the adhesion layer 205, the metal seed layer 210, and the metal layer 215, respectively. In some embodiments, the adhesion layer 205 and the metal seed layer 210 may include U-shape cross-section. The metal layer 220 may include a bar-shape cross-section. In some embodiments, the metal layer 220 is thinner than the metal layer 215.

Figure 23:
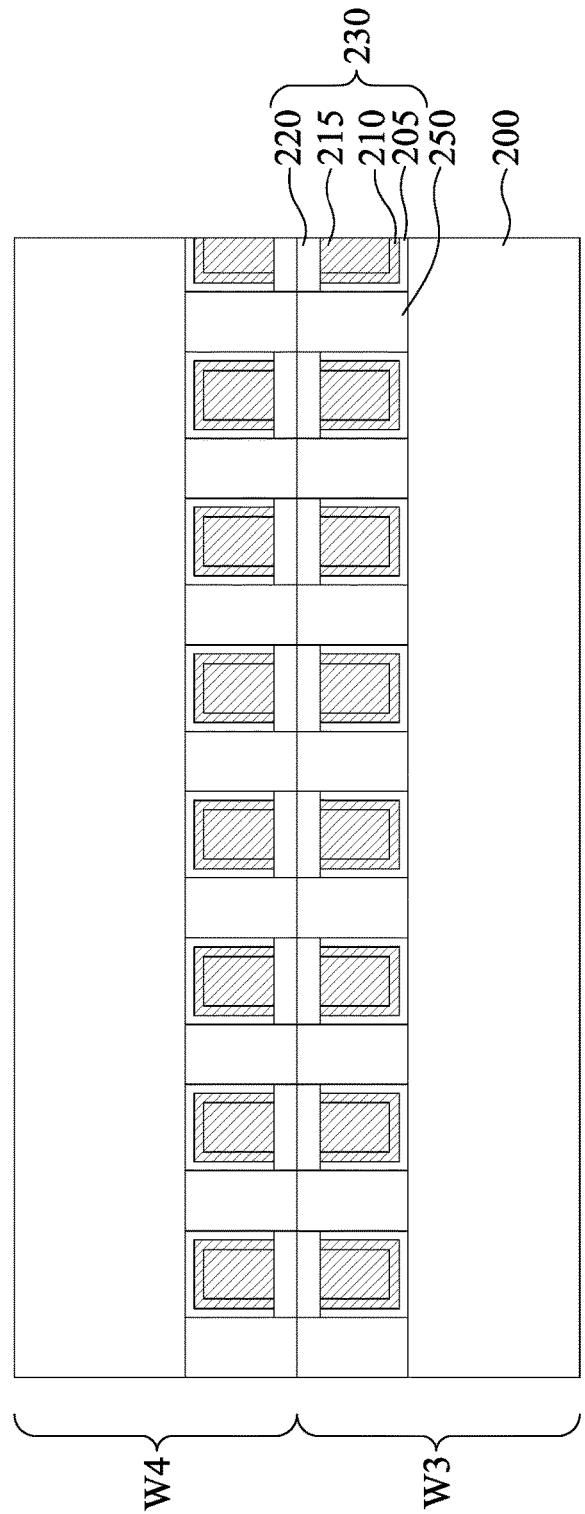

Reference is made to FIG. 23. Shown there are two semiconductor wafers W3 and W4. In such embodiments, the wafers W3 and W4 may include substantially a same configuration formed by the processes as described in FIGS. 6 to 22. For example, each of the wafers W3 and W4 includes a substrate 200, a dielectric layer 250 over the substrate 200, and connectors 230 in the dielectric layer 250.

In the embodiments of FIG. 23, the wafer W4 is rotated one-hundred and eighty degrees. Once the metal layer 220 of each connector 230 of the wafer W3 faces the metal layer 220 of each connector 230 of the wafer W4, the metal layers 220 of the wafer W3 may be bonded together with the metal layers 220 of the wafer W4, which may join the wafers W3 and W4. In greater details, the wafers W3 and W4 are pressed against each other, such that the metal layer 220 of each connector 230 of the wafer W3 is in contact with a corresponding metal layer 220 of each connector 230 of the wafer W4. In some embodiments, the metal layer 220 can also be referred to as bonding metal or bonding layer of the connector 230, and the metal layer 215 can be referred to as body metal of the connector 230.

In some embodiments, the wafers W3 and W4 are bonded with each other using thermo-compression bonding process. The thermo-compression bonding process may be performed under a temperature in a range from about 160° C. to about 200° C. (e.g., 180° C.) or lower than about 200° C. As mentioned above with respect to FIG. 5, such temperature may cause the native oxide of the metal layer 220 (e.g., silver oxide) decomposed, and oxygen will be released from the metal layer 220, leaving the metal layers 220 having a pure metal surface (e.g., silver) for bonding process. Accordingly, by using the metal layer 220 made of silver as a bonding layer, the thermo-compression bonding process can be performed in a low temperature and can be performed under atmospheric pressure.

As mentioned above, the metal layer 220 is made of silver, which has a face-center-cubic (FCC) structure. It is noted that silver atoms have highest diffusion rate at (111) surface of the FCC structure. As mentioned above, the metal layer 220 made of silver has a (111) orientation, and thus the time duration and the temperature for the bonding process can be significantly reduced. In some embodiments, the thermo-compression bonding process may be performed for about 10 min to about 30 min.

Figure 24:
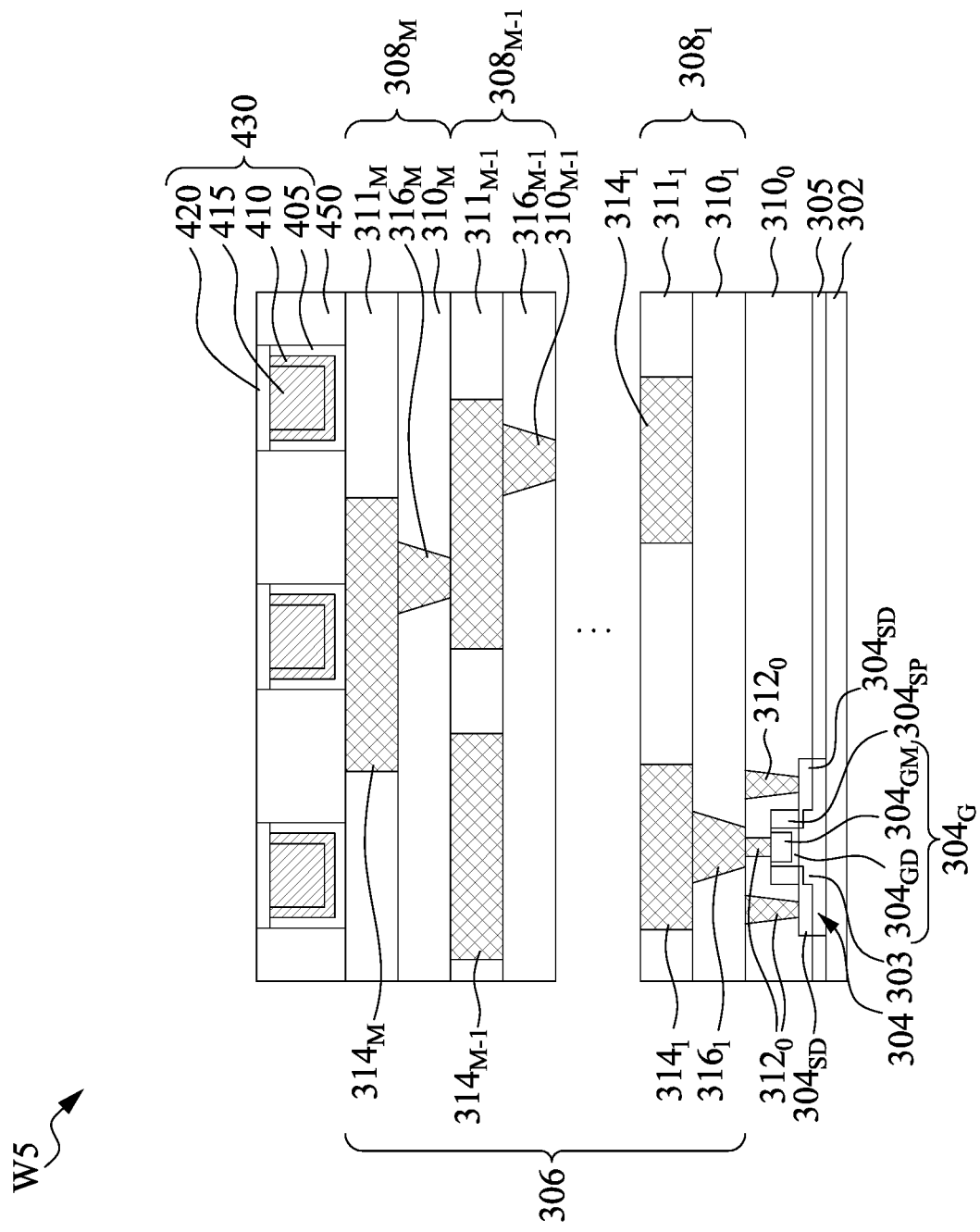
FIGS. 24 to 25 show various stages of a sequential manufacturing operation for wafer to wafer bonding in accordance with some embodiments of the present disclosure.
Figure 25:
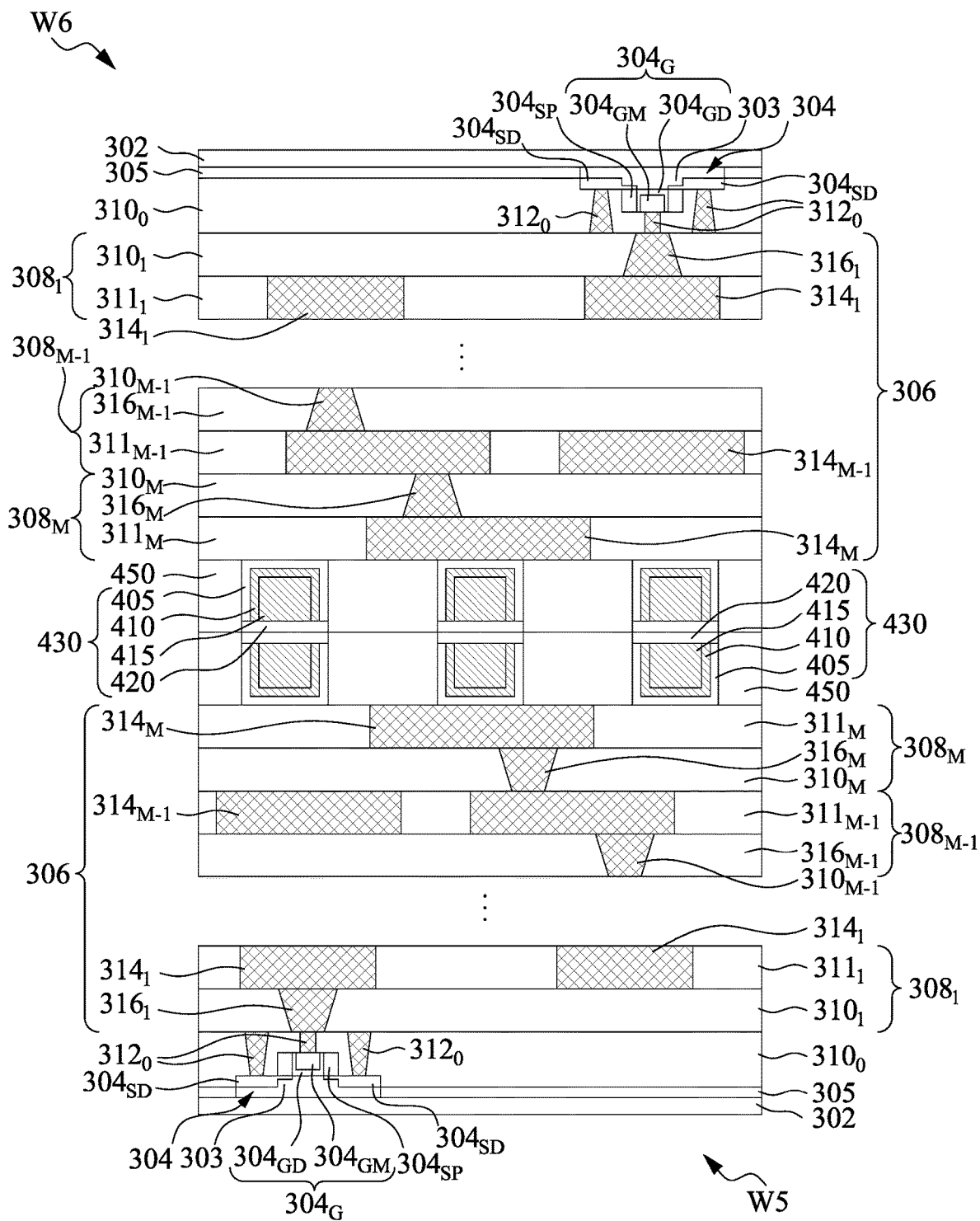

FIGS. 24 to 25 show various stages of a sequential manufacturing operation for wafer to wafer bonding in accordance with some embodiments of the present disclosure.

Reference is made to FIG. 24. Shown there is a semiconductor wafer W5, in which the wafer W5 is an intermediate structure of an IC manufacturing process where transistors and an interconnect structure have been formed. In some embodiments, the semiconductor wafer W5 may include a substrate 302. The substrate 102 may include, for example, bulk silicon, doped or undoped, or an active layer of a semiconductor-on-insulator (SOI) substrate.

In some embodiments, one or more active and/or passive devices 304 (illustrated as a single transistor) are formed on the substrate 302. The one or more devices 304 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 306 is formed over the one or more devices 304 and the substrate 302. The interconnect structure 306 electrically interconnects the one or more devices 304 to form functional electrical circuits over the semiconductor structure 302. The interconnect structure 306 may comprise one or more metallization layers $308_1$ to $308_M$, in which M is the number of the one or more metallization layers $308_1$ to $308_M$. In some embodiments, the value of M may vary according to design specifications of the semiconductor structure 302. In what follows, the one or more metallization layers $308_1$ to $308_M$ may also be collectively referred to as the one or more metallization layers 308. The metallization layers $308_1$ to $308_M$ include dielectric layers $310_1$ to $310_M$ and dielectric layers $311_1$ to $311_M$, respectively. The dielectric layers $311_1$ to $311_M$ are formed over the corresponding dielectric layers $310_1$ to $310_M$. The metallization layers $308_1$ to $308_M$ include one or more horizontal interconnects, such as conductive lines $314_1$ to $314_M$, respectively extending horizontally or laterally in dielectric layers $311_1$ to $311_M$ and vertical interconnects, such as conductive vias $316_1$ to $316_M$, respectively extending vertically in dielectric layers $310_1$ to $310_M$. Formation of the interconnect structure 306 can be referred to as a back-end-of-line (BEOL) process.

Contact plugs $312_0$ electrically couple the overlying interconnect structure 306 to the underlying devices 304. In the depicted embodiments, the devices 304 are fin field-effect transistors (FinFET) that are three-dimensional MOSFET structure formed in fin-like strips of semiconductor protrusions 303 referred to as fins. The cross-section shown in FIG. 24 is taken along a longitudinal axis of the fin in a direction parallel to the direction of the current flow between the source/drain regions $304_{SD}$.

Shallow trench isolation (STI) regions 305 formed on opposing sidewalls of the fin 103. STI regions 305 may be formed by depositing one or more dielectric materials (e.g., silicon oxide) to completely fill the trenches around the fins and then recessing the top surface of the dielectric materials.

In some embodiments, a gate structure $304_G$ of the FinFET device 304 is a high-k, metal gate (HKMG) gate structure that may be formed using a gate-last process flow. The gate dielectric layer $304_{GD}$ includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof; or multilayers thereof. In some embodiments, the gate metal layer $304_{GM}$ may be a multilayered metal gate stack including a barrier layer, a work function layer, and a gate-fill layer formed successively on top of gate dielectric layer $304_{GD}$. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof.

Spacers $304_{SP}$ are disposed on opposite sidewalls of the gate structure $304_G$. Source/drain regions $304_{SD}$ are disposed over the substrate 302 and on opposite sides of the gate structure $304_G$. Spacers $304_{SP}$ may include one or more dielectrics, such as silicon oxide, silicon nitride, silicon oxynitride, silicon carbide, silicon carbonitride, the like, or a combination thereof. Source/drain regions $304_{SD}$ are doped regions in the semiconductor fin 303. The source/drain regions $304_{SD}$ may also be epitaxy structures. The epitaxy structures may be elemental (e.g., Si, or Ge, or the like), or an alloy (e.g., $Si_{1-x}C_x$, or $Si_{1-x}Ge_x$, or the like).

Interlayer dielectric (ILD) layer $310_0$ is deposited over the substrate 302, and covering the source/drain regions $304_{SD}$ and the gate structure $304_G$. In some embodiments, the ILD layer $310_0$ may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof.

Electrodes of electronic devices formed in the substrate 302 may be electrically connected to conductive lines $314_1$ to $314_M$ and the conductive vias $316_1$ to $316_M$ using contacts $112_0$ formed through the intervening dielectric layers. For example, the contacts $112_0$ make electrical connections to the gate structure $304_G$ and the source/drain regions $304_{SD}$ of FinFET 304. The contacts $112_0$ may be formed using photolithography, etching and deposition techniques. The contacts may be made of metal.

A dielectric layer 450 is disposed over the interconnect structure 306. A plurality of connectors 430 are disposed in the dielectric layer 450. In some embodiments, each connector 430 may include an adhesion layer 405, a metal seed layer 410, a metal layer 415, and a metal layer 420. Materials and formation methods of the dielectric layer 450, the adhesion layer 405, the metal seed layer 410, the metal layer 415, and the metal layer 420 may be similar to those described with respect to the dielectric layer 250, the adhesion layer 205, the metal seed layer 210, the metal layer 215, and the metal layer 220 in FIGS. 6 to 23, and thus relevant details will not be repeated for brevity. For example, the dielectric layer 450 is formed over the interconnect structure 306, and then the connectors 430 are formed in the dielectric layer 450.

Reference is made to FIG. 25. Shown there are two semiconductor wafers W5 and W6. In such embodiments, the wafers W5 and W6 may include substantially a same configuration as described in FIG. 24. In the embodiments of FIG. 25, the wafer W6 is rotated one-hundred and eighty degrees. Once the metal layer 420 of each connector 430 of the wafer W5 faces the metal layer 420 of each connector 430 of the wafer W46, the metal layers 420 of the wafer W5 may be bonded together with the metal layers 420 of the wafer W6, which may join the wafers W5 and W6. The wafers W5 and W6 may be bonded with each other using a thermo-compression bonding process, which is similar to that described with respect to FIGS. 6 to 23, and thus relevant details will not be repeated for brevity.

FIGS. 26 to 32 are cross-sectional views of forming a package structure in accordance with some embodiments of the present disclosure.

Figure 26:
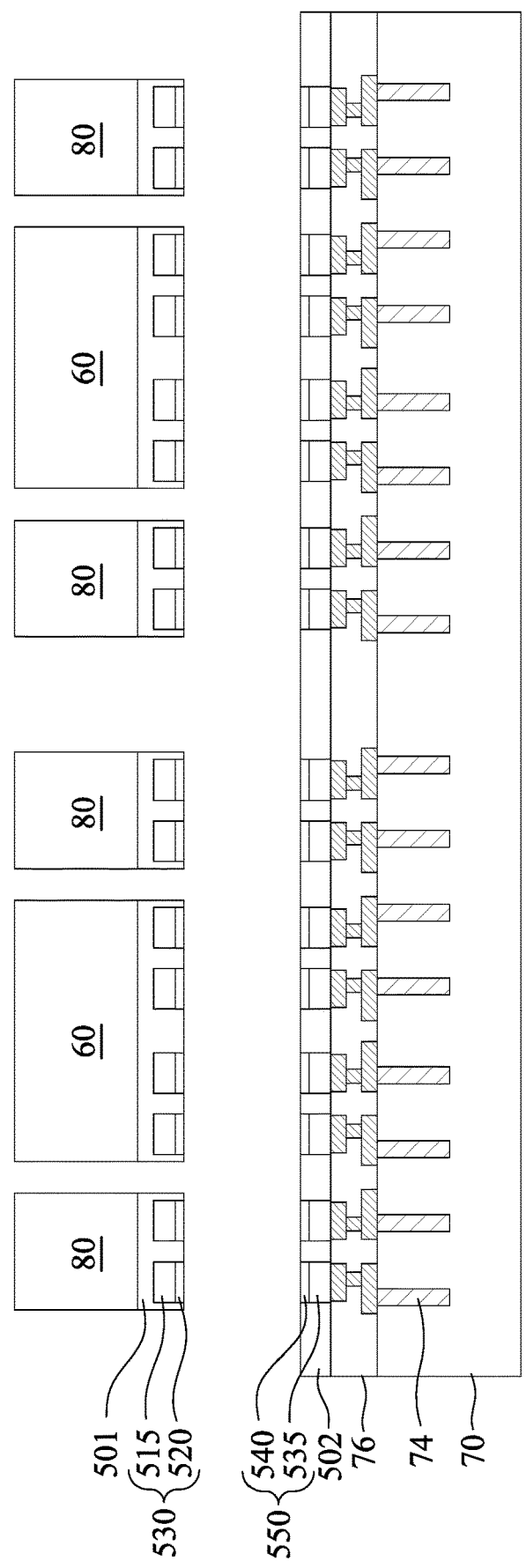
FIGS. 26 to 32 are cross-sectional views of forming a package structure in accordance with some embodiments of the present disclosure.

Reference is made to FIG. 26. Shown there are a plurality of dies 60 and 80. In some embodiments, the dies 60 may include one or more logic dies (e.g., central processing unit, graphics processing unit, system-on-a-chip (SoC), field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof.

In some embodiments, the dies 80 include one or more memory dies, such as a stack of memory dies (e.g., DRAM dies, SRAM dies, High-Bandwidth Memory (HBM) dies, Hybrid Memory Cubes (HMC) dies, or the like).

Each of the dies 60 and 80 may include a plurality of connectors 530, which are similar to the connectors 230 as described in FIGS. 6 to 23. In some embodiments, each connector 530 may include a metal layer 515 and a metal layer 520 over the metal layer 515. Materials and formation methods of the metal layers 515 and the metal layer 520 may be similar to the metal layer 215 and the metal layer 220 as described in FIGS. 6 to 23, and thus relevant details will not be repeated for brevity. In some other embodiments, each connector 530 may also include an adhesion layer and a metal seed layer, which are similar to the adhesion layer 205 and the metal seed layer 210 as described in FIGS. 6 to 23. In some embodiments, the connectors 530 may be formed in a dielectric layer 501 of the dies 60 and 80. The dielectric layer 501 may be similar to the dielectric layer 250 as described in FIGS. 6 to 23.

FIG. 26 also illustrates a silicon interposer 70. In some embodiments, the silicon interposer 70 may include a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Through-vias (TVs) 74 are formed to extend from the top surface of silicon interposer 70 into the silicon interposer 70. The TVs 74 are also sometimes referred to as through-substrate vias or through-silicon vias when silicon interposer 70 is a silicon substrate. The TVs 74 may be formed by forming recesses in the silicon interposer 70 by, for example, etching, milling, laser techniques, a combination thereof, and/or the like. A conductive material may be deposited in the recesses. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the silicon interposer 70 by, for example, CMP.

The silicon interposer 70 further includes a redistribution structure 76 formed over the top surface of the silicon interposer 70, and is used to electrically connect the integrated circuit devices, if any, and/or TVs 74 together and/or to external devices. The redistribution structure 76 may include one or more dielectric layer(s) and respective metallization pattern(s) in the dielectric layer(s). The metallization patterns may include vias and/or traces to interconnect any devices and/or TVs 74 together and/or to an external device.

The silicon interposer 70 further includes a plurality of connectors 550 disposed over the redistribution structure 76, which are similar to the connectors 230 as described in FIGS. 6 to 23. The connectors 550 may be electrically connected to the metallization patterns in the redistribution structure 76. In some embodiments, each connector 550 may include a metal layer 535 and a metal layer 540 over the metal layer 535. Materials and formation methods of the metal layers 535 and the metal layer 540 may be similar to the metal layer 215 and the metal layer 220 as described in FIGS. 6 to 23, and thus relevant details will not be repeated for brevity. In some other embodiments, each connector 550 may also include an adhesion layer and a metal seed layer, which are similar to the adhesion layer 205 and the metal seed layer 210 as described in FIGS. 6 to 23. In some embodiments, the connectors 550 may be formed in a dielectric layer 502 over the silicon interposer 70. The dielectric layer 502 may be similar to the dielectric layer 250 as described in FIGS. 6 to 23.

Figure 27:
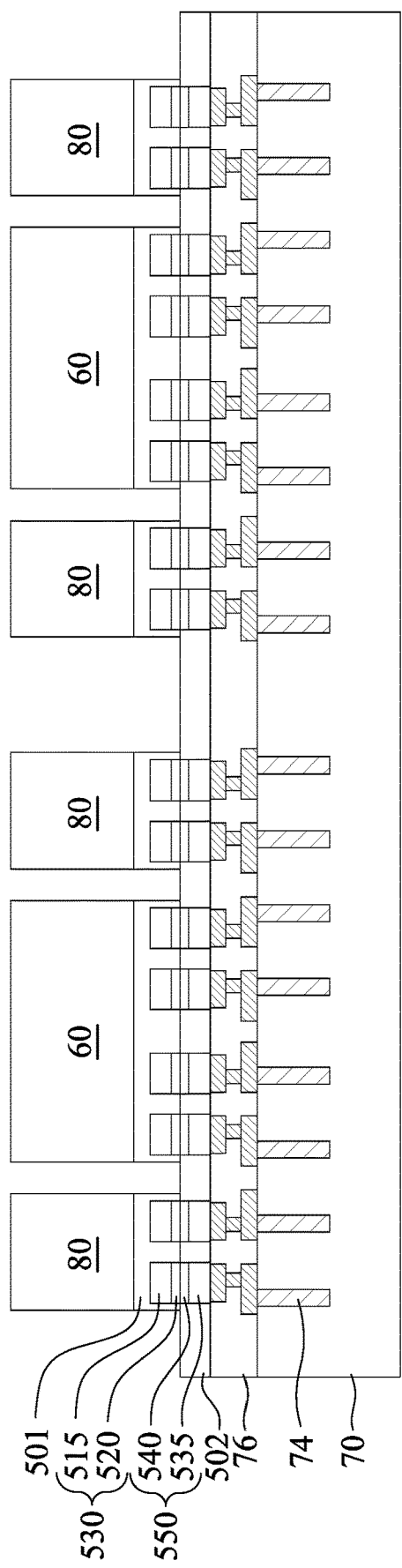

Reference is made to FIG. 27. The dies 60 and the dies are attached to the silicon interposer 70, for example, through flip-chip bonding by way of the connectors 530 on the dies 60 and 68, and the connectors 550 on the silicon interposer 70. The dies 60 and the dies 80 may be placed on the silicon interposer 70 using, for example, a pick-and-place tool, such that the connectors 530 on the dies 60 and 68 may be attached with corresponding connectors 550 on the silicon interposer 70. In some embodiments, dielectric layer 501 over the dies 60/80 may be in contact with dielectric layer 502 over the silicon interposer 70.

Once the metal layer 520 of each connector 530 of the dies 60/80 are attached to the corresponding metal layer 540 of each connector 550 of the silicon interposer 70, the metal layers 520 of the dies 60/80 may be bonded together with the metal layers 540 of the silicon interposer 70, which may join the dies 60/80 and the silicon interposer 70. The dies 60/80 may be bonded to the silicon interposer 70 using a thermo-compression bonding process, which is similar to that described with respect to FIGS. 6 to 23, and thus relevant details will not be repeated for brevity.

Figure 28:
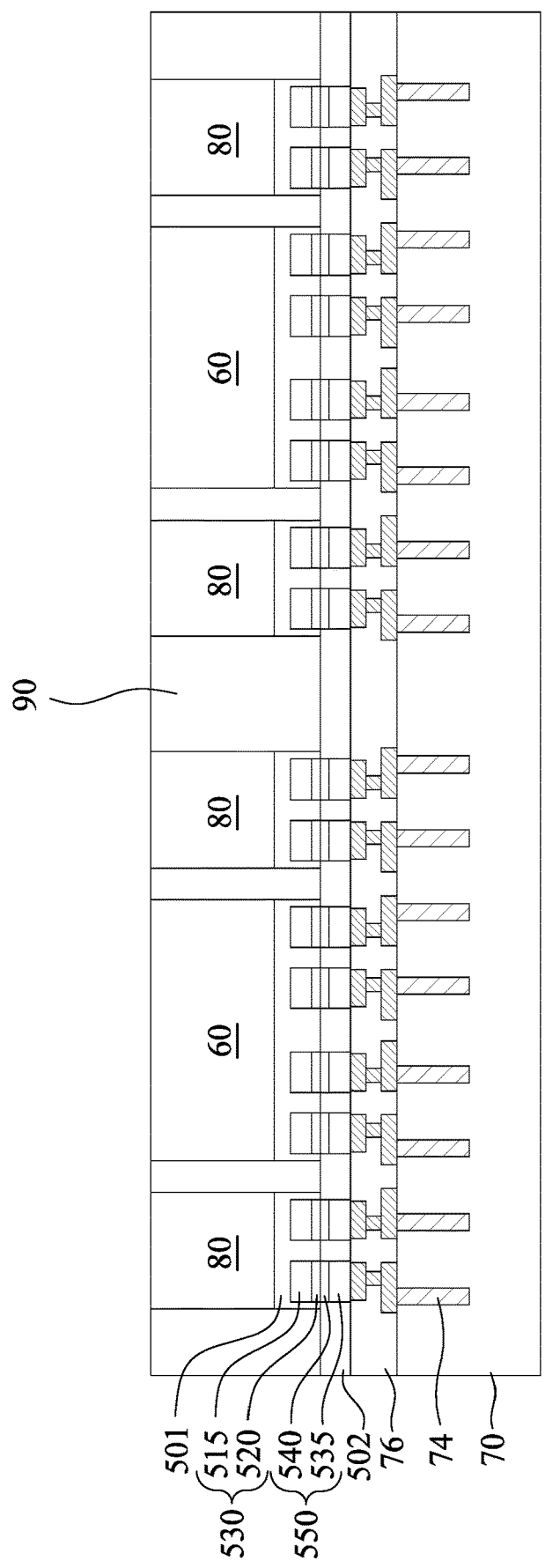

Reference is made to FIG. 28. An encapsulant 90 is formed on the various components, such as the dies 60 and 80. The encapsulant 90 may be a molding compound, epoxy, or the like, and may be applied by compression molding, transfer molding, or the like. A curing step is performed to cure the encapsulant 90, such as a thermal curing, an Ultra-Violet (UV) curing, or the like. In some embodiments, the dies 60 and 80 are buried in the encapsulant 90, and after the curing of the encapsulant 90, a planarization step, such as a grinding, may be performed to remove excess portions of the encapsulant 90, which excess portions are over top surfaces of dies 60 and 80. Accordingly, top surfaces of dies 60 and 80 are exposed, and are level with a top surface of the encapsulant 90. In some embodiments, the encapsulant 90 is in contact with the sidewalls of the dielectric layer 501 and top surface of the dielectric layer 502.

Figure 29:
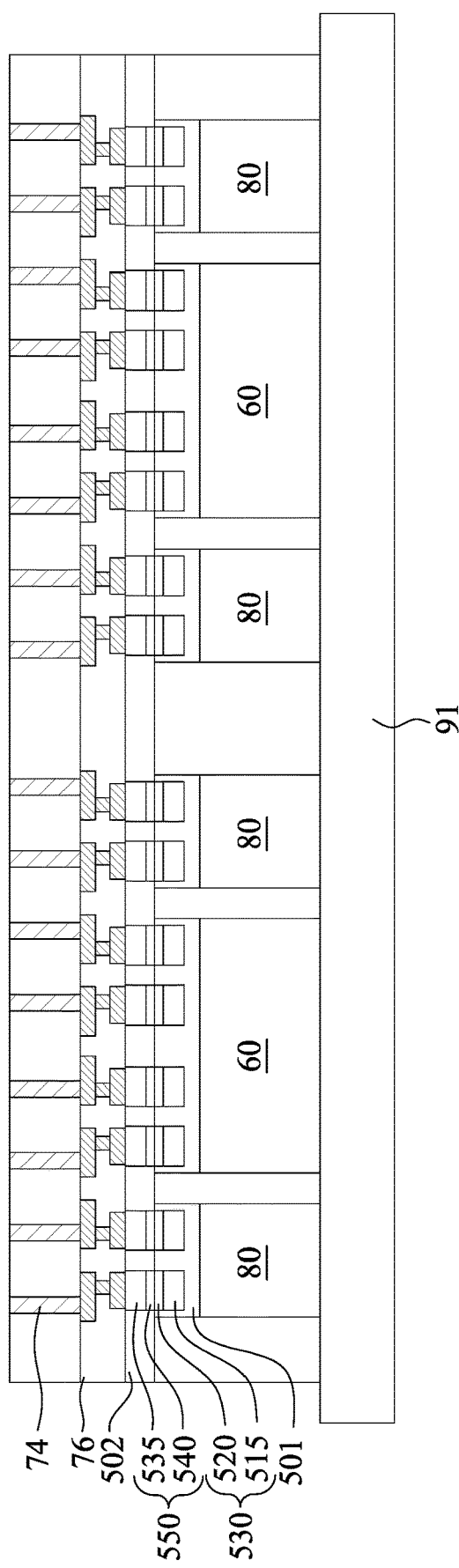

Reference is made to FIG. 29. The structure of FIG. 28 is flipped over and may be placed on a carrier substrate 91. Afterwards, a thinning process is performed on the silicon interposer 70 to thin the silicon interposer 70 until TVs 74 are exposed. The thinning process may include an etching process, a grinding process, the like, or a combination thereof.

Figure 30:
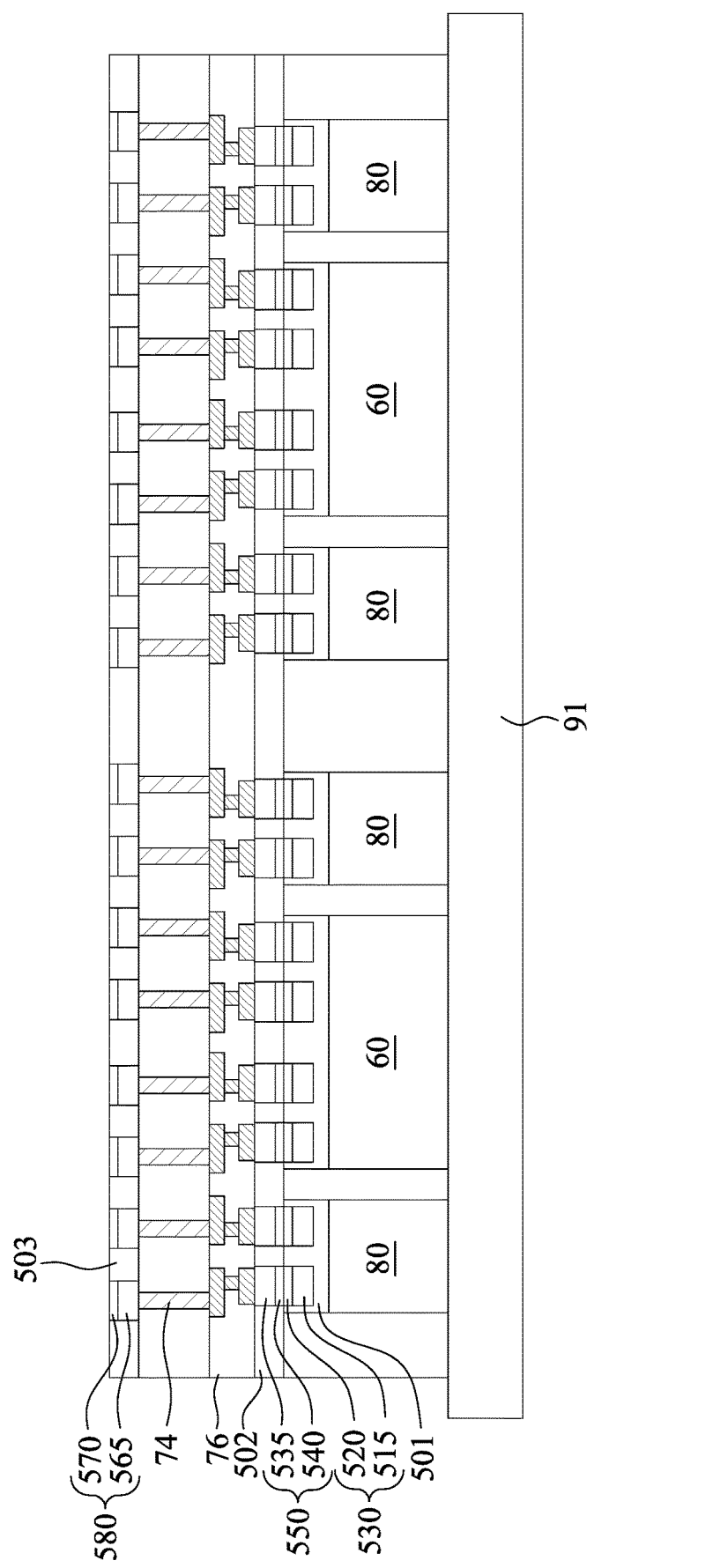

Reference is made to FIG. 30. A plurality of connectors 580 are formed over the silicon interposer 70. For example, a dielectric layer 503 may be formed over the silicon interposer 70, and connectors 580 are then formed in the dielectric layer 503. The dielectric layer 503 may be similar to the dielectric layer 250 as described in FIGS. 6 to 23.

In some embodiments, the connectors 580 are similar to the connectors 230 as described in FIGS. 6 to 23. For example, each connector 580 may include a metal layer 565 and a metal layer 570 over the metal layer 565. Materials and formation methods of the metal layers 565 and the metal layer 570 may be similar to the metal layer 215 and the metal layer 220 as described in FIGS. 6 to 23, and thus relevant details will not be repeated for brevity. In some other embodiments, each connector 580 may also include an adhesion layer and a metal seed layer, which are similar to the adhesion layer 205 and the metal seed layer 210 as described in FIGS. 6 to 23.

Figure 31:
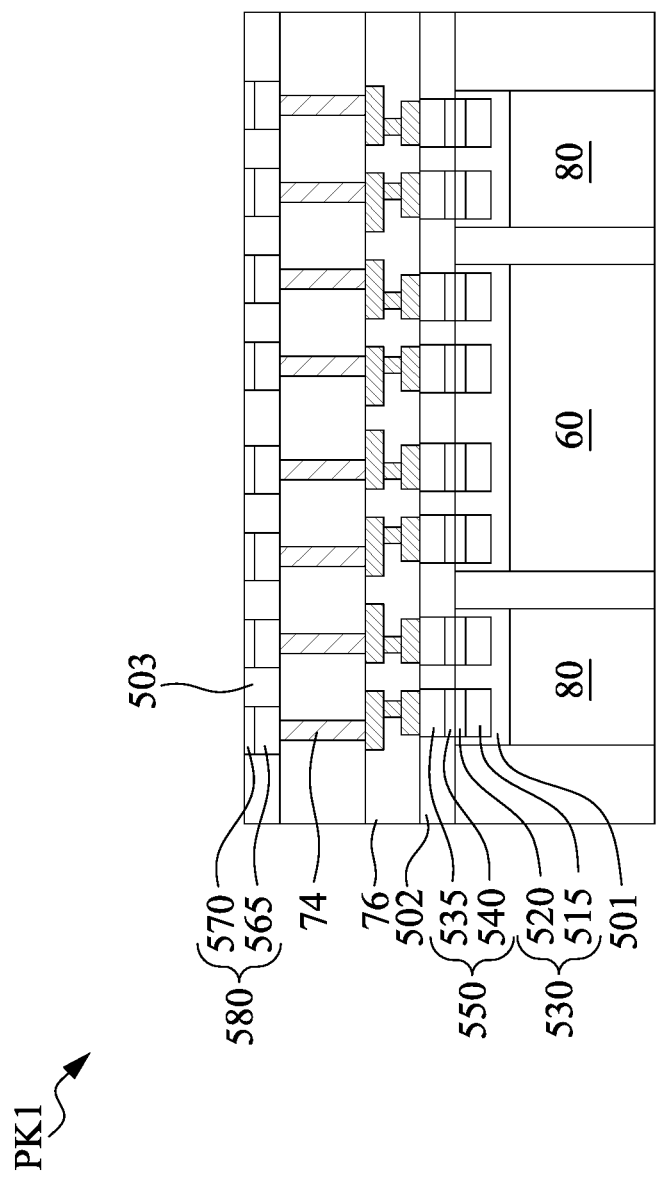

Reference is made to FIG. 31. The structure of FIG. 30 is singulated to form individual package structure PK1. The singulation may be sawing, dicing, or the like. In some embodiments, each package structure PK1 include the silicon interposer 70 with one die 60 and two dies 80 disposed on the silicon interposer 70. However, the present disclose is not limited thereto.

Figure 32:
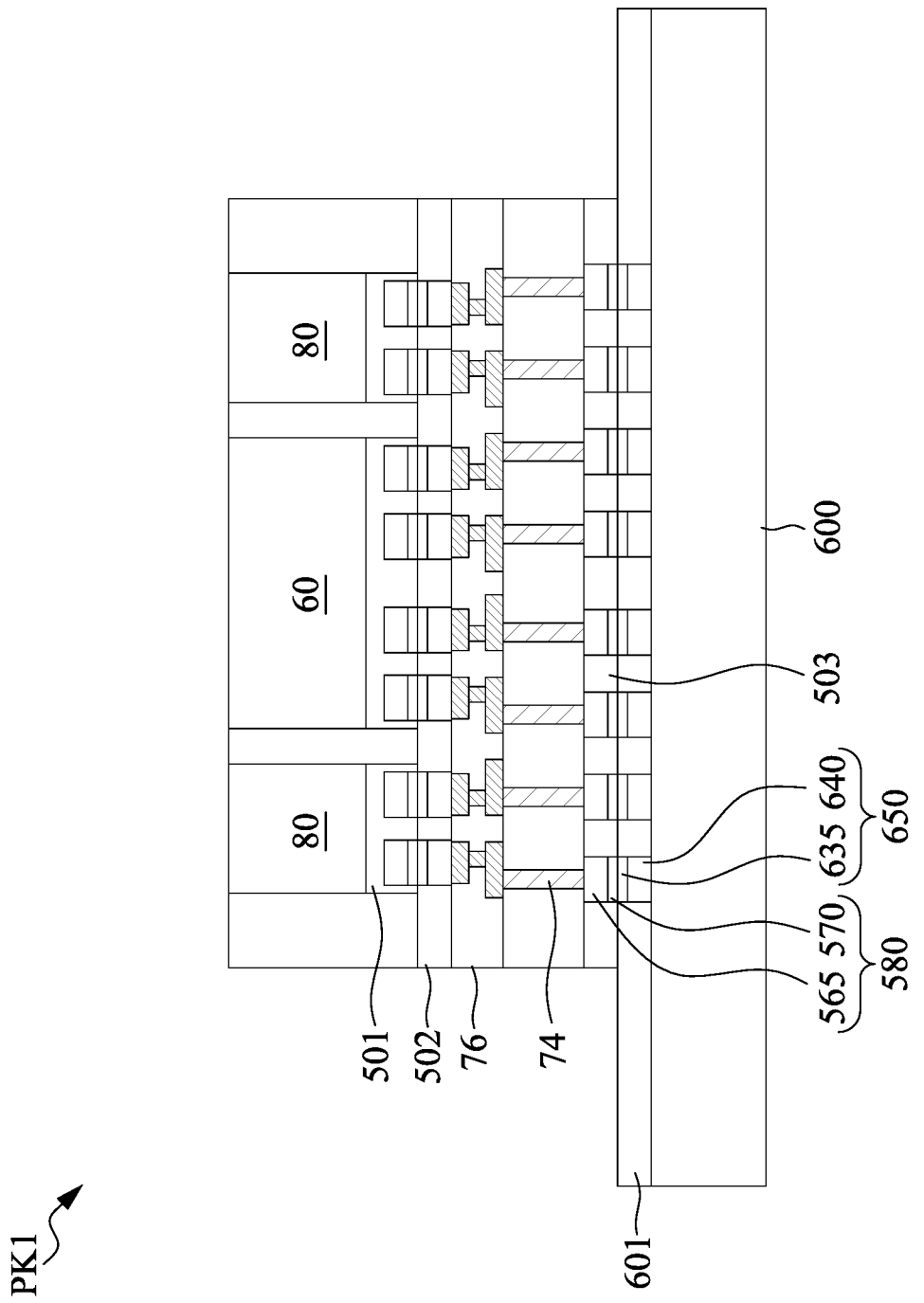

Reference is made to FIG. 32. The package structure PK1 is attached to a substrate 600. The substrate 600 may include a package substrate, such as a build-up substrate including a core therein, a laminate substrate including a plurality of laminated dielectric films, a PCB, or the like. The substrate 600 includes a plurality of connectors 650, which are similar to the connectors 230 as described in FIGS. 6 to 23.

In some embodiments, each connector 650 may include a metal layer 635 and a metal layer 640 over the metal layer 635. Materials and formation methods of the metal layers 635 and the metal layer 640 may be similar to the metal layer 215 and the metal layer 220 as described in FIGS. 6 to 23, and thus relevant details will not be repeated for brevity. In some other embodiments, each connector 650 may also include an adhesion layer and a metal seed layer, which are similar to the adhesion layer 205 and the metal seed layer 210 as described in FIGS. 6 to 23. In some embodiments, the connectors 650 may be formed in a dielectric layer 601 over the substrate 600. The dielectric layer 601 may be similar to the dielectric layer 250 as described in FIGS. 6 to 23.

The package structure PK1 may be placed on the substrate 600 using, for example, a pick-and-place tool, such that the connectors 580 on silicon interposer 70 of the package structure PK1 may be attached with corresponding connectors 650 on the substrate 600.

Once the metal layer 570 of each connector 580 of the package structure PK1 are attached to the metal layer 640 of each connector 650 of the substrate 600, the metal layers 570 may be bonded together with the metal layers 640, which may join the package structure PK1 and the substrate 600. The package structure PK1 may be bonded to the substrate 600 using a thermo-compression bonding process, which is similar to that described with respect to FIGS. 6 to 23, and thus relevant details will not be repeated for brevity. In some embodiments, the dielectric layer 503 is in contact with the dielectric layer 601.

Figure 33:
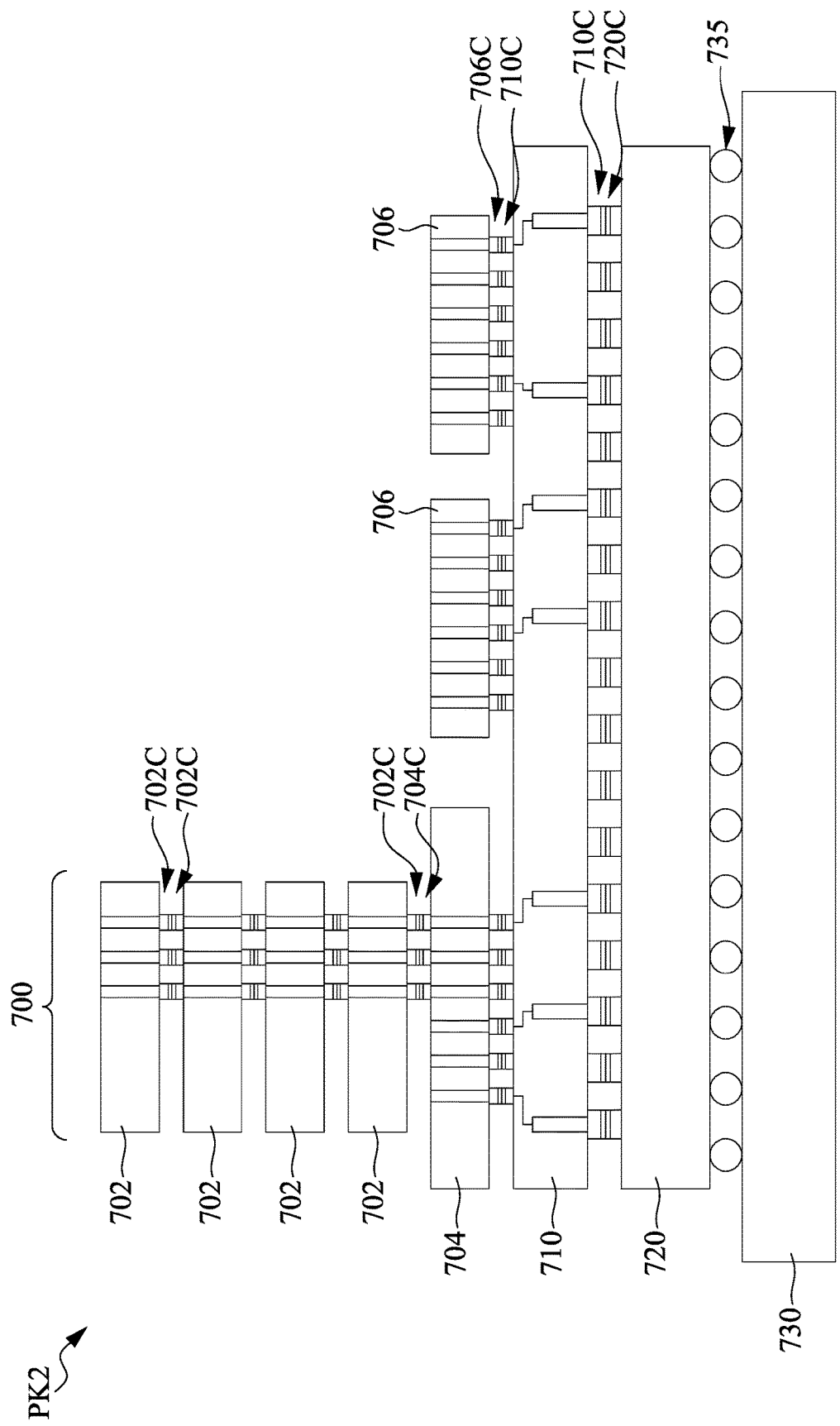
FIG. 33 is a cross-sectional view of a package structure in accordance with some embodiments of the present disclosure.

FIG. 33 is a cross-sectional view of a package structure in accordance with some embodiments of the present disclosure. FIG. 33 illustrates a package structure PK2. In some embodiments, the package structure PK2 may be a Chip-On-Wafer-On-Substrate (CoWoS) structure.

The package structure PK2 includes a die stack 700, in which the die stack 700 includes a plurality of dies 702 stacked over each other, and a die 704 as a bottom die of the die stack 700. In some embodiments, each of the dies 702 may be memory die (e.g., DRAM dies, SRAM dies, High-Bandwidth Memory (HBM) dies, Hybrid Memory Cubes (HMC) dies, or the like). In some embodiments, the die 704 may be a logic die.

Each of the dies 702 may include a plurality of connectors 702C. In some embodiments, each connector 702C may include substantially a same configuration as the connector 230 as described in FIGS. 6 to 23. For example, each of the connectors 702C may include a first metal and a second metal over the first metal, in which the first and second metals may be similar to the metal layers 215 and 220 as described in FIGS. 6 to 23. The dies 702 are bonded to each other through the connectors 702C. The bonding process is similar to the bonding process as described in FIGS. 6 to 23. For example, second metal of connector 702C of a die 702 is connected to a corresponding second metal of connector 702C of another die 702, and then a thermos-compression bonding process is performed to join two adjacent dies 702.

The die 704 may include a plurality of connectors 704C. In some embodiments, each connector 704C may include substantially a same configuration as the connector 230 as described in FIGS. 6 to 23. For example, each of the connectors 704C may include a first metal and a second metal over the first metal, in which the first and second metals may be similar to the metal layers 215 and 220 as described in FIGS. 6 to 23. The bottommost die 702 is bonded to the die 704 through the connectors 702C and 704C. The bonding process is similar to the bonding process as described in FIGS. 6 to 23. For example, second metal of connector 702C of the bottommost die 702 is connected to a corresponding second metal of connector 704C of the die 704, and then a thermos-compression bonding process is performed to join the bottommost die 702 and the die 704.

The package structure PK2 further includes a plurality of logic dies 706. The die stack 700 and the logic dies 706 are bonded to an interposer 710. The interposer 710 may be a silicon wafer having interconnect structures for electrically connecting active devices (not shown) in die stacks 700 and logic dies 706 to form functional circuits.

Each of the dies 706 may include a plurality of connectors 706C, and the interposer 710 includes a plurality of connectors 710C. In some embodiments, each connector 706C/710C may include substantially a same configuration as the connector 230 as described in FIGS. 6 to 23. For example, each of the connectors 706C/710C may include a first metal and a second metal over the first metal, in which the first and second metals may be similar to the metal layers 215 and 220 as described in FIGS. 6 to 23.

The die stack 700 is bonded to the interposer 710 through the connectors 704C and 710C, and the logic dies 706 are bonded to the interposer 710 through the connectors 706C and 710C. The bonding process is similar to the bonding process as described in FIGS. 6 to 23. For example, second metal of connector 704C of the logic die 704 of the die stack 700 is connected to a corresponding second metal of connector 710C of the interposer 710, and then a thermos-compression bonding process is performed to join the logic die 704 of the die stack 700 and the interposer 710. Similarly, second metal of connector 706C of the logic dies 706 is connected to a corresponding second metal of connector 710C of the interposer 710, and then a thermos-compression bonding process is performed to join the logic dies 706 and the interposer 710.

The package structure PK2 further includes a substrate 720. The substrate 720 may be any suitable package substrate, such as a printed circuit board (PCB), an organic substrate, a ceramic substrate, a motherboard, or the like. The substrate 720 includes a plurality of connectors 720C. In some embodiments, each connector 720C may include substantially a same configuration as the connector 230 as described in FIGS. 6 to 23. For example, each of the connectors 720C may include a first metal and a second metal over the first metal, in which the first and second metals may be similar to the metal layers 215 and 220 as described in FIGS. 6 to 23.

The interposer 710 is bonded to the substrate 720 through the connectors 710C and 720C. The bonding process is similar to the bonding process as described in FIGS. 6 to 23. For example, second metal of connector 710C of the interposer 710 is connected to a corresponding second metal of connector 720C of the substrate 720, and then a thermos-compression bonding process is performed to join the interposer 710 and the substrate 720.

The package structure PK2 further includes a circuit board 730. In some embodiments, the circuit board 730 may include several device components of an electrical system. In some embodiments, the substrate 720 is bonded to the circuit board 730 through bumps 735, which include different materials than the connectors 702c, 704C, 706C, 710C and 720C. The bumps 735 are solder balls and/or metal bumps, such as ball grid array (BGA) balls, C4 micro bumps, ENIG formed bumps, ENEPIG formed bumps, or the like.

FIGS. 34 to 44 show various stages of a sequential manufacturing operation for wafer to wafer bonding in accordance with some embodiments of the present disclosure. It is noted that some elements of FIGS. 34 to 44 are similar to those described in FIGS. 1 to 5 and FIGS. 6 to 23, and thus relevant details will not be repeated for brevity.

Figure 34:
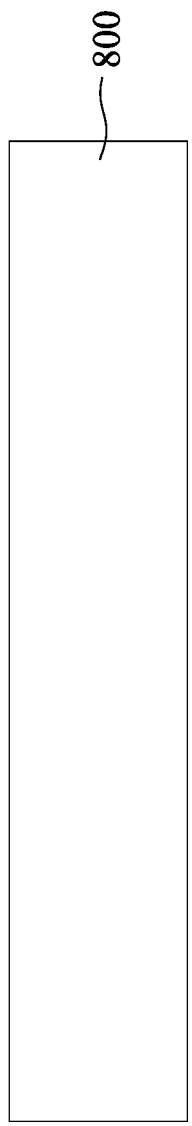
FIGS. 34 to 44 show various stages of a sequential manufacturing operation for wafer to wafer bonding in accordance with some embodiments of the present disclosure.

Reference is made to FIG. 34. Shown there is a substrate 800, in which the substrate 800 may be similar to the substrate 100 as described in FIGS. 1 to 5. In some embodiments, the substrate 800 may include the transistor and the interconnection structure as described in FIG. 24.

Figure 35:
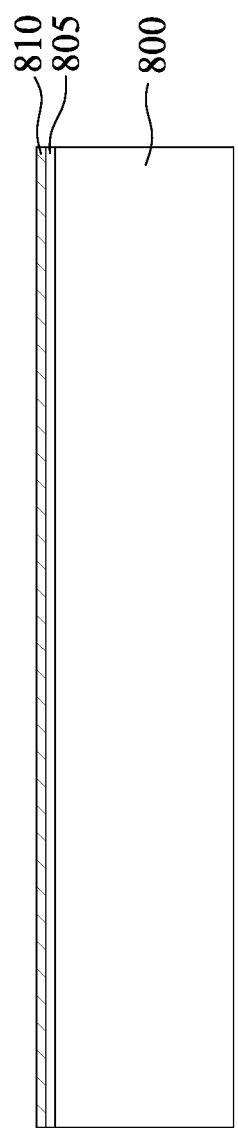

Reference is made to FIG. 35. An adhesion layer 805 is deposited over the substrate 800. Afterwards, a metal seed layer 810 is deposited over the adhesion layer 805. The adhesion layer 805 may be similar to the adhesion layer 205 as described in FIGS. 6 to 23, and the metal seed layer 810 may be similar to the metal seed layer 210 as described in FIGS. 6 to 23.

Figure 36:
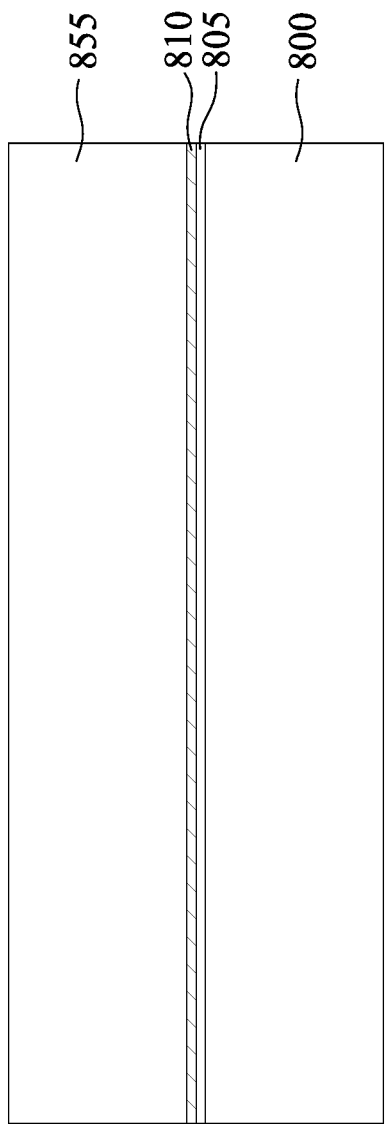

Reference is made to FIG. 36. A mask layer 855 is formed over the metal seed layer 810. In some embodiments, the mask layer 855 is a photoresist.

Figure 37:
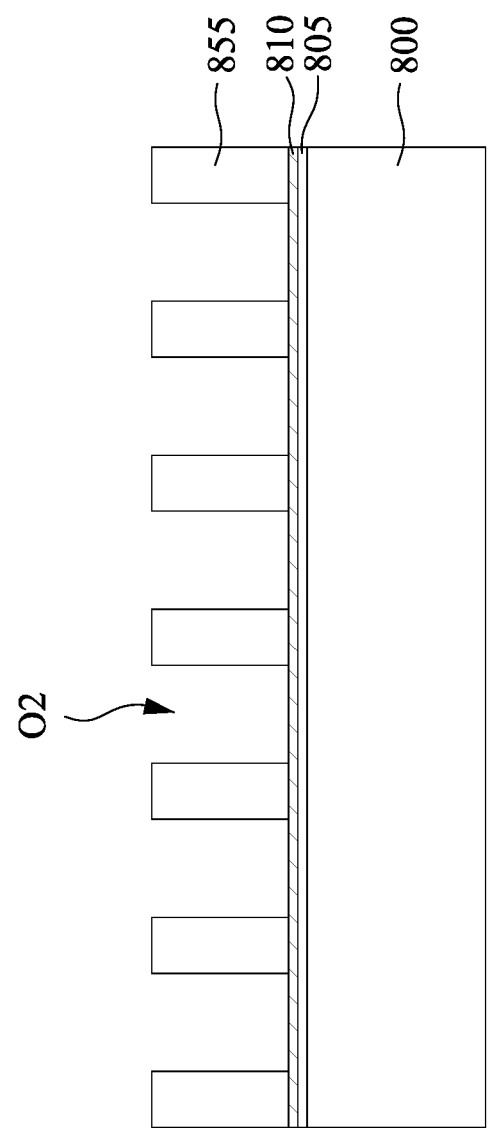

Reference is made to FIG. 37. The mask layer 855 is patterned to form openings O2 in the mask layer 855. In some embodiments, the openings O2 may expose the metal seed layer 810.

Figure 38:
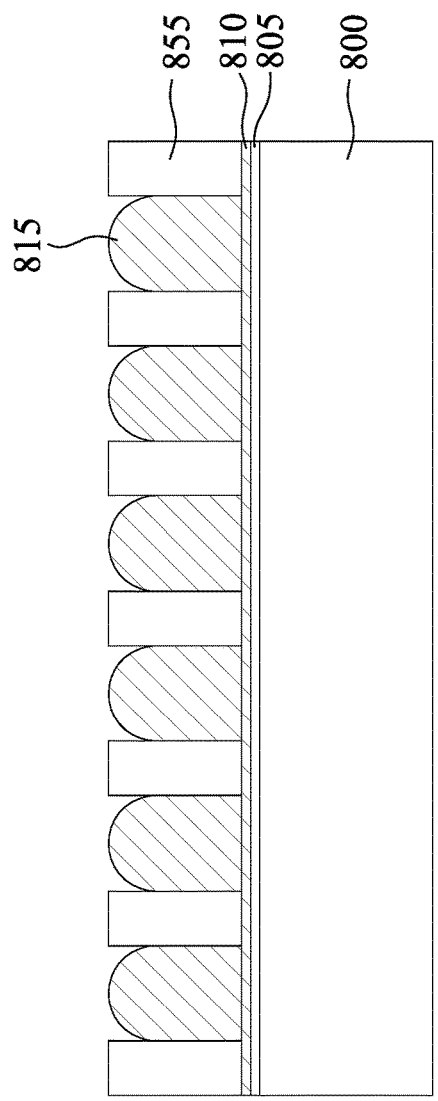

Reference is made to FIG. 38. A metal layer 815 is deposited over the exposed portions of the metal seed layer 810 through the openings O2. The metal layer 815 may be deposited using electroplating process similar as the metal layer 115 described in FIGS. 1 to 5. In some embodiments, each portion of the metal layer 815 in the opening O2 has a rounded top surface. In some embodiments, the metal layer 815 is selectively formed on the exposed portions of the metal seed layer 810. That is, the metal layer 815 has a higher deposition rate on the surfaces of the metal seed layer 810 than on the surfaces of the mask layer 855. Accordingly, after the metal layer 815 is formed, the top surface of the mask layer 855 may be free from coverage by the metal layer 815.

Figure 39:
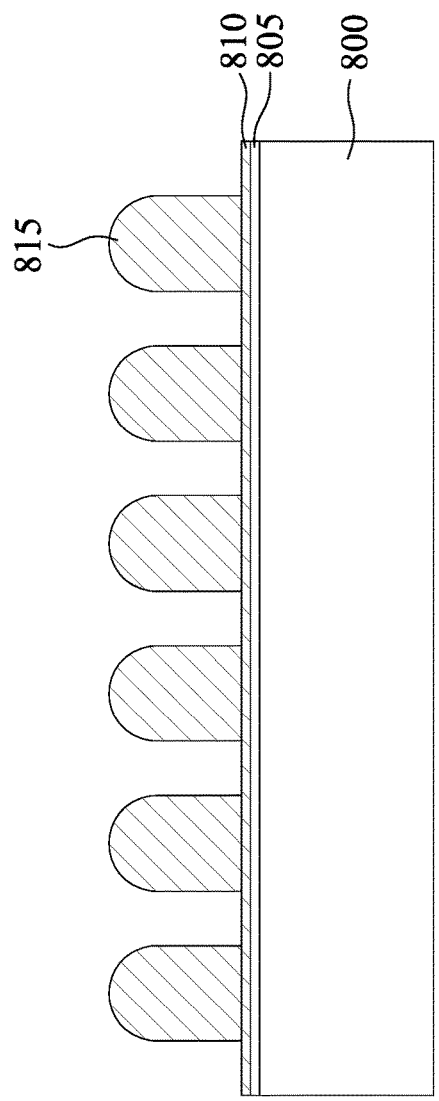

Reference is made to FIG. 39. The mask layer 855 is removed. After the mask layer 855 is removed, portions of the metal seed layer 810 that are under the mask layer 855 (see FIG. 38) may be exposed. In some embodiments where the mask layer 855 is a photoresist, the mask layer 855 may be removed using a lift-off process.

Figure 40:
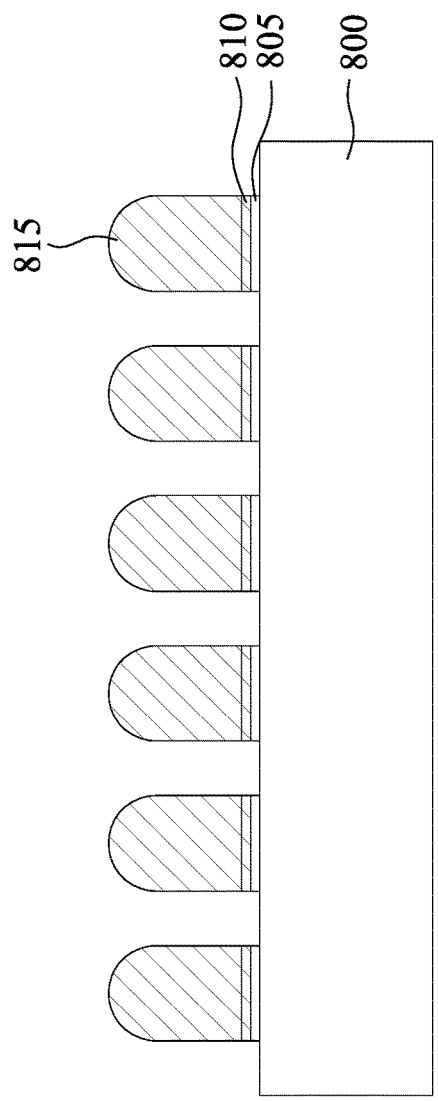

Reference is made to FIG. 40. An etching process is performed to remove portions of the metal seed layer 810 and the adhesion layer 805 that are uncovered by the metal layer 815, so as to cut the metal seed layer 810 and the adhesion layer 805 into individual portions. After the etching process is completed, top surface of the substrate 800 may be exposed. In some embodiments, an anisotropic etching may be performed to remove the metal seed layer 810 and the adhesion layer 805 through spacers within the metal layer 815. In some embodiments, the metal layer 815 may also be etched, and thus top surface of the metal layer 815 may be lowered as a result of the etching process. In some embodiments, each portion of the metal layer 815 and the underlying metal seed layer 810 and the adhesion layer 805 may include substantially a same width.

Figure 41:
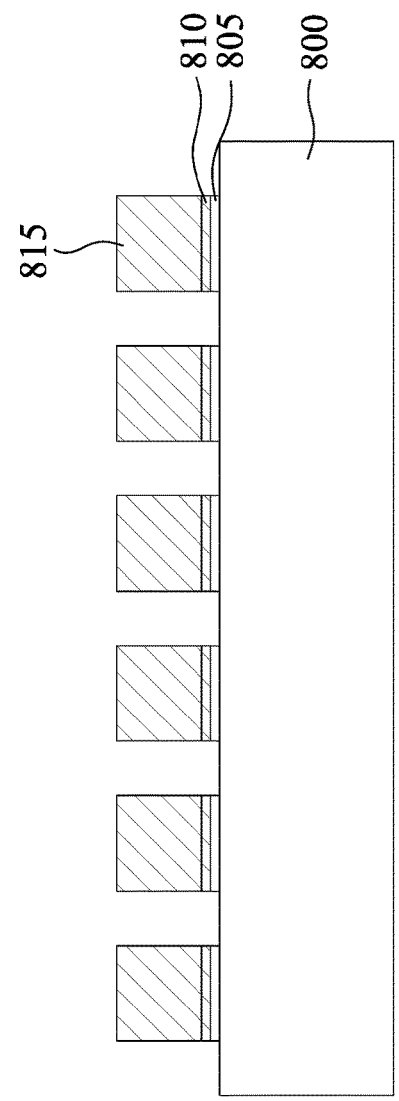

Reference is made to FIG. 41. A chemical mechanism polishing (CMP) process is performed to planarize the top surface of the metal layer 815.

Figure 42:
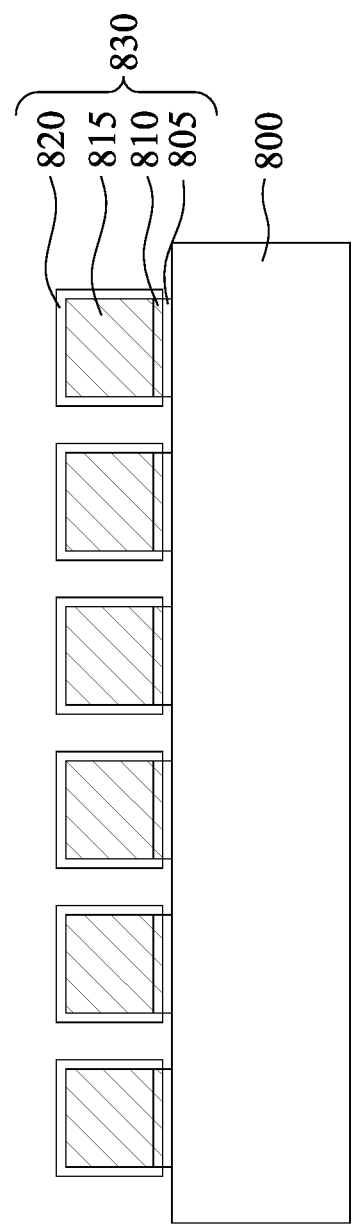

Reference is made to FIG. 42. A metal layer 820 is selectively formed over the surfaces of the metal layer 815 and the metal seed layer 810. In some embodiments, the metal layer 820 may be similar to the metal layer 220, and may be formed using the method as described with respect to FIGS. 14 to 21, and thus relevant details will not be repeated for brevity. In some embodiments, the metal layer 820 has a higher formation rate on the surfaces of the metal layer 815 and the metal seed layer 810 than on the surfaces of the adhesion layer 802. For example, the metal layer 820 may not be formed on the adhesion layer 802, and thus after the metal layer 820 is formed, the sidewalls of the adhesion layer 802 remain exposed.

After the metal layer 820 is formed, a plurality of connectors 830 are formed. Each of the connectors 830 may include the adhesion layer 805, the metal seed layer 810, the metal layer 815, and the metal layer 820. In some embodiments, the metal layer 820 may be in contact with the metal seed layer 810 and the metal layer 815. In some embodiments, the adhesion layer 805 and the metal seed layer 810 may include a bar-shape cross-section. The metal layer 820 may include a U-shape cross-section. In some embodiments, the metal layer 820 may cover top surface and sidewalls of the metal layer 815, and may extend to opposite sidewalls of the metal seed layer 810. In some embodiments, the sidewalls of the adhesion layer 805 are free from coverage by the metal layer 820.

Figure 43:
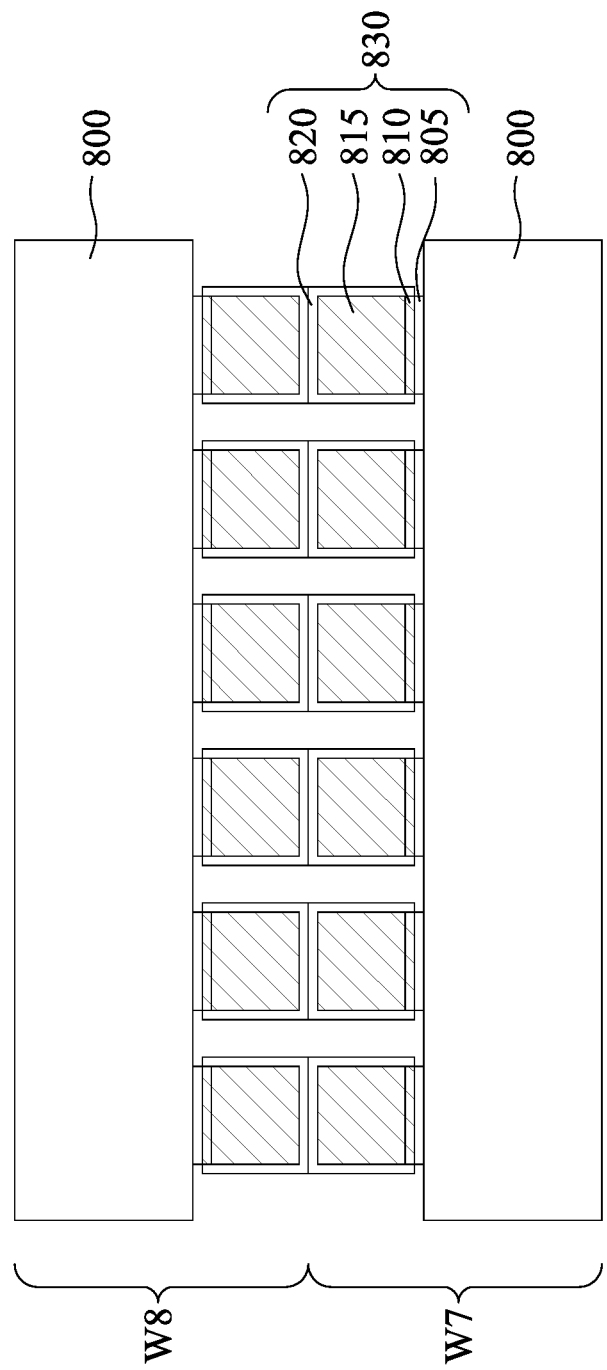

Reference is made to FIG. 43. Shown there are two semiconductor wafers W7 and W8. In such embodiments, the wafers W7 and W8 may include substantially a same configuration formed by the processes as described in FIGS.

34 to 42. For example, each of the wafers W7 and W8 includes a substrate 800 and connectors 830 over the substrate 800.

In the embodiments of FIG. 43, the wafer W8 is rotated one-hundred and eighty degrees. Once the metal layer 820 of each connector 830 of the wafer W7 faces the metal layer 820 of each connector 830 of the wafer W8, the metal layers 820 of the wafer W7 may be bonded together with the metal layers 820 of the wafer W8, which may join the wafers W7 and W8. In greater details, the wafers W7 and W8 are pressed against each other, such that the metal layer 820 of each connector 830 of the wafer W7 is in contact with a corresponding metal layer 820 of each connector 830 of the wafer W8. In some embodiments, the metal layer 820 can also be referred to as bonding metal or bonding layer of the connector 830, and the metal layer 815 can be referred to as body metal of the connector 830. In some embodiments, the wafers W7 and W8 are bonded with each other using thermo-compression bonding process as described in FIG. 23, and thus relevant details will not be repeated for brevity.

Figure 44:
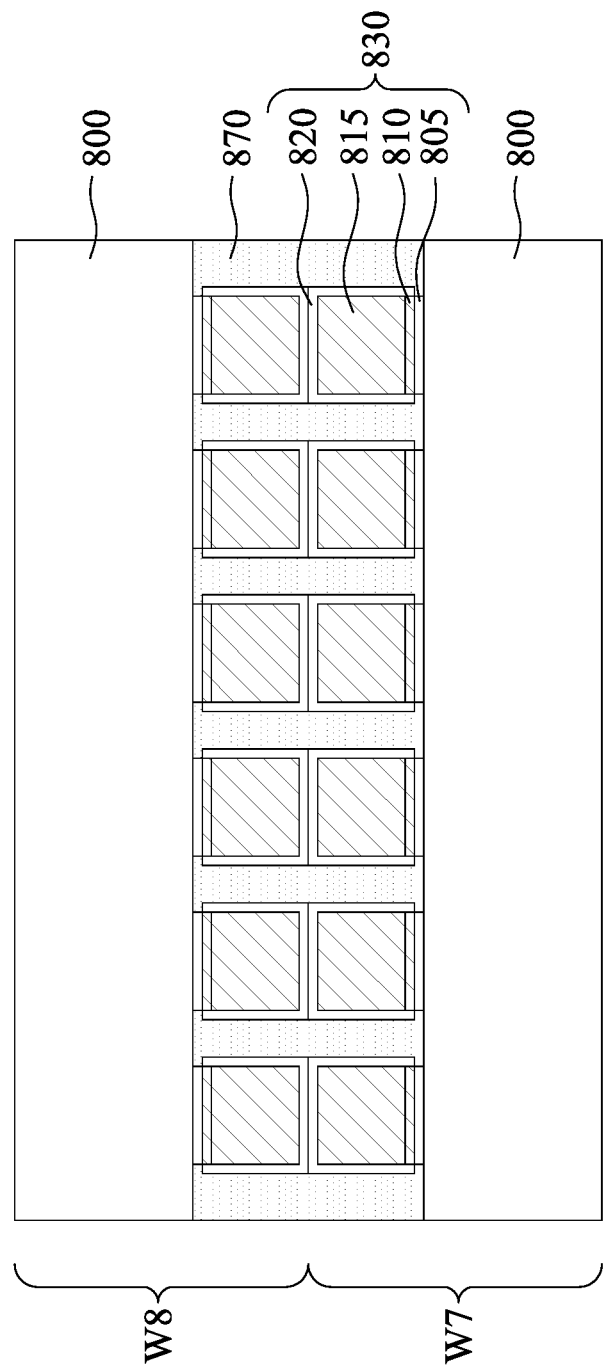

In the embodiments of FIG. 44. After the wafers W7 and W8 are bonded with each other. Underfill material 870 is formed to fill the spaces between the wafers W7 and W8. In some embodiments, the underfill material 870 may laterally surround and in contact with each of the connectors 830 of the wafers W7 and W8. In some embodiments, the underfill material 870 may be in contact with the metal layer 820 and the adhesion layer 805 of each connector 830. In some embodiments, the underfill material 870 may include an epoxy or a polymer, or the like.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that embodiments of the present disclosure provide a bonding structure, in which the bonding structure includes a first metal layer and a second metal layer over the first metal layer. The first metal layer is made of copper with nano-twinned structure. The second metal layer made of silver can be formed over the first metal layer using an electroless plating deposition process, such that the second metal layer also includes a nano-twinned structure. The electroless plating deposition process is a selective deposition process, and thus the process cost can be reduced. Furthermore, the bonding process using silver as bonding layer can reduce bonding temperature and bonding time, and can be performed under atmosphere pressure rather than vacuum environment.

In some embodiments of the present disclosure, a method includes forming a first connector and a second connector over a first wafer and a second wafer, respectively, in which each of the first and second connectors are formed by forming an opening in a dielectric layer; depositing a first metal layer in the opening, in which the first metal layer has a nano-twinned structure with (111) orientation; and depositing a second metal layer over the first metal layer, the second metal layer and the first metal layer being made of different materials, in which the second metal layer has a nano-twinned structure with (111) orientation; attaching the first wafer to the second wafer, such that that the second metal layer of the first connector on the first wafer is in contact with the second metal layer of the second connector on the second wafer; and performing a thermo-compression process to bond the first and second wafers.

In some embodiments, the first metal layer is made of copper and the second metal layer is made of silver.

In some embodiments, the first metal layer is deposited by an electro deposition process and the second metal layer is deposited by an electroless deposition process.

In some embodiments, the method further includes forming an adhesion layer in the opening of the dielectric layer; and forming a metal seed layer over the adhesion layer, in which the first metal layer is deposited over the metal seed layer.

In some embodiments, the method further includes prior to depositing the second metal layer, performing a first planarization process to the first metal layer, the metal seed layer, and the adhesion layer; and performing a second planarization process to the second metal layer.

In some embodiments, the second metal layer is made of silver, and forming the second metal layer includes immersing the first metal layer in acetone; immersing the first metal layer in rising liquid; immersing the first metal layer in deionized water; immersing the first metal layer in sulfuric acid; immersing the first metal layer in deionized water again; immersing the first metal layer in a first solution including silver nitrate; and immersing the first metal layer in a second solution including silver nitrate, in which a concentration of silver nitrate in the second solution is higher than a concentration of silver nitrate in the first solution.

In some embodiments, the second metal layer is made of silver, the thermo-compression process is performed a native silver oxide on the second metal layer is decomposed during the thermo-compression process.

In some embodiments, the second metal layer has a higher deposition rate on the first metal layer than on the dielectric layer.

In some embodiments, the second metal layer is thinner than the first metal layer.

In some embodiments of the present disclosure, a method includes bonding a die to a silicon interposer by connecting a first connector of a die to a second connector on a first side of the silicon interposer, in which the second connector of the silicon interposer is electrically connected to a via in the silicon interposer; performing a grinding process to a second side of the silicon interposer to expose the via in the silicon interposer, the second side of the silicon interposer being opposite to the first side of the silicon interposer; forming a third connector on the second side of the silicon interposer and electrically connected to the via; and bonding the silicon interposer to a substrate by connecting the third connector of the silicon interposer to a fourth connector of the substrate, in which the first, second, third, and fourth connectors each includes a metal having a nano-twinned structure with (111) orientation.

In some embodiments, the metal of each of the first, second, third, and fourth connectors includes a copper layer and a silver layer over the copper layer, v the copper layer and the silver layer both include a nano-twinned structure with (111) orientation.

In some embodiments, forming the third connector includes forming an opening in a dielectric layer; depositing a first metal layer in the opening by an electro deposition process; and depositing a second metal layer over the first metal layer by an electroless deposition process, the second metal layer and the first metal layer being made of different materials.

In some embodiments, the second metal layer has a higher deposition rate on the first metal layer than on the dielectric layer.

In some embodiments, bonding the die to the silicon interposer is performed under a temperature lower than about 200° C., and bonding the silicon interposer to the substrate is performed under a temperature lower than about 200° C.

In some embodiments, the method further includes forming an encapsulant over the first side of the silicon interposer to encapsulate the die prior to performing the grinding process; and performing a singulation process through the encapsulant and the silicon interposer to form a package structure prior to bonding the silicon interposer to the substrate.

In some embodiments of the present disclosure, a structure includes a silicon interposer, a die, and a substrate. The silicon interposer includes a first connector on a first side of the silicon interposer and a second connector on a second side of the silicon interposer opposite to the first side of the silicon interposer. The die is bonded to the silicon interposer from the first side of the silicon interposer, in which the die includes a third connector connected to the first connector of the silicon interposer. The substrate is bonded to the silicon interposer from the second side of the silicon interposer, in which the substrate includes a fourth connector connected to the second connector of the silicon interposer. The first, second, third, and fourth connectors each includes a body metal and a bonding metal, in which the body metal and the bonding metal both include a nano-twinned structure with (111) orientation.

In some embodiments, the body metal is made of copper and the bonding metal is made of silver.

In some embodiments, the silicon interposer includes a first dielectric layer surrounding the first connector, and the die includes a second dielectric layer surrounding the third connector, and the first dielectric layer is in contact with the second dielectric layer.

In some embodiments, the structure further includes a circuit board bonded to the substrate, the substrate being vertically between the circuit board and the silicon interposer, in which the circuit board is bonded to the substrate through a metal bump made of a different material than the first, second, third, and fourth connectors.

In some embodiments, each of the first, second, third, and fourth connector further includes an adhesion layer, the adhesion layer is in contact with the bonding metal and covers at least three sides of the body metal in a cross-sectional view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first connector and a second connector over a first wafer and a second wafer, respectively, wherein each of the first and second connectors are formed by:
   forming an opening in a dielectric layer;
   depositing a first metal layer in the opening, wherein the first metal layer has a nano-twinned structure with (111) orientation; and
   depositing a second metal layer over the first metal layer, the second metal layer and the first metal layer being made of different materials, wherein the second metal layer has a nano-twinned structure with (111) orientation;
   attaching the first wafer to the second wafer, such that that the second metal layer of the first connector on the first wafer is in contact with the second metal layer of the second connector on the second wafer; and
   performing a thermo-compression process to bond the first and second wafers.

2. The method of claim 1, wherein the first metal layer is made of copper and the second metal layer is made of silver.

3. The method of claim 1, wherein the first metal layer is deposited by an electro deposition process and the second metal layer is deposited by an electroless deposition process.

4. The method of claim 1, further comprising:
   forming an adhesion layer in the opening of the dielectric layer; and
   forming a metal seed layer over the adhesion layer, wherein the first metal layer is deposited over the metal seed layer.

5. The method of claim 4, further comprising:
   prior to depositing the second metal layer, performing a first planarization process to the first metal layer, the metal seed layer, and the adhesion layer; and
   performing a second planarization process to the second metal layer.

6. The method of claim 1, wherein the second metal layer is made of silver, and forming the second metal layer comprises:
   immersing the first metal layer in acetone;
   immersing the first metal layer in rising liquid;
   immersing the first metal layer in deionized water;
   immersing the first metal layer in sulfuric acid;
   immersing the first metal layer in deionized water again;
   immersing the first metal layer in a first solution including silver nitrate; and
   immersing the first metal layer in a second solution including silver nitrate, wherein a concentration of silver nitrate in the second solution is higher than a concentration of silver nitrate in the first solution.

7. The method of claim 1, wherein the second metal layer is made of silver, the thermo-compression process is performed a native silver oxide on the second metal layer is decomposed during the thermo-compression process.

8. The method of claim 1, wherein the second metal layer has a higher deposition rate on the first metal layer than on the dielectric layer.

9. The method of claim 1, wherein the second metal layer is thinner than the first metal layer.

10. A method, comprising:
    bonding a die to a silicon interposer by connecting a first connector of a die to a second connector on a first side of the silicon interposer, wherein the second connector of the silicon interposer is electrically connected to a via in the silicon interposer;
    performing a grinding process to a second side of the silicon interposer to expose the via in the silicon interposer, the second side of the silicon interposer being opposite to the first side of the silicon interposer;
    forming a third connector on the second side of the silicon interposer and electrically connected to the via; and
    bonding the silicon interposer to a substrate by connecting the third connector of the silicon interposer to a fourth connector of the substrate, wherein the first, second, third, and fourth connectors each comprises a metal having a nano-twinned structure with (111) orientation.

11. The method of claim 10, wherein the metal of each of the first, second, third, and fourth connectors comprises:
   a copper layer; and
   a silver layer over the copper layer, wherein the copper layer and the silver layer both include a nano-twinned structure with (111) orientation.

12. The method of claim 10, wherein forming the third connector comprises:
   forming an opening in a dielectric layer;
   depositing a first metal layer in the opening by an electro deposition process; and
   depositing a second metal layer over the first metal layer by an electroless deposition process, the second metal layer and the first metal layer being made of different materials.

13. The method of claim 12, wherein the second metal layer has a higher deposition rate on the first metal layer than on the dielectric layer.

14. The method of claim 10, wherein bonding the die to the silicon interposer is performed under a temperature lower than about 200° C., and bonding the silicon interposer to the substrate is performed under a temperature lower than about 200° C.

15. The method of claim 10, further comprising:
   forming an encapsulant over the first side of the silicon interposer to encapsulate the die prior to performing the grinding process; and
   performing a singulation process through the encapsulant and the silicon interposer to form a package structure prior to bonding the silicon interposer to the substrate.

16. A structure, comprising:
   a silicon interposer comprising a first connector on a first side of the silicon interposer and a second connector on a second side of the silicon interposer opposite to the first side of the silicon interposer;
   a die bonded to the silicon interposer from the first side of the silicon interposer, wherein the die comprises a third connector connected to the first connector of the silicon interposer; and
   a substrate bonded to the silicon interposer from the second side of the silicon interposer, wherein the substrate comprises a fourth connector connected to the second connector of the silicon interposer, wherein the first, second, third, and fourth connectors each comprises:
      a body metal; and
      a bonding metal, wherein the body metal and the bonding metal both include a nano-twinned structure with (111) orientation.

17. The structure of claim 16, wherein the body metal is made of copper and the bonding metal is made of silver.

18. The structure of claim 16, wherein the silicon interposer comprises a first dielectric layer surrounding the first connector, and the die comprises a second dielectric layer surrounding the third connector, and the first dielectric layer is in contact with the second dielectric layer.

19. The structure of claim 16, further comprising a circuit board bonded to the substrate, the substrate being vertically between the circuit board and the silicon interposer, wherein the circuit board is bonded to the substrate through a metal bump made of a different material than the first, second, third, and fourth connectors.

20. The structure of claim 16, wherein each of the first, second, third, and fourth connector further comprises an adhesion layer, the adhesion layer is in contact with the bonding metal and covers at least three sides of the body metal in a cross-sectional view.

* * * * *